US012559623B2

(12) United States Patent
Iseki et al.

(10) Patent No.: US 12,559,623 B2
(45) Date of Patent: Feb. 24, 2026

(54) RESIN COMPOSITION AND ELECTROMAGNETIC WAVE ABSORBER

(71) Applicant: MITSUBISHI CHEMICAL CORPORATION, Tokyo (JP)

(72) Inventors: Shuta Iseki, Hiratsuka (JP); Hidekazu Shoji, Hiratsuka (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 313 days.

(21) Appl. No.: 18/001,801

(22) PCT Filed: Jun. 16, 2021

(86) PCT No.: PCT/JP2021/022815

§ 371 (c)(1),
(2) Date: Dec. 14, 2022

(87) PCT Pub. No.: WO2021/256488

PCT Pub. Date: Dec. 23, 2021

(65) Prior Publication Data

US 2023/0340252 A1 Oct. 26, 2023

(30) Foreign Application Priority Data

Jun. 17, 2020 (JP) ................................ 2020-104511
Jun. 25, 2020 (JP) ................................ 2020-109525

(Continued)

(51) Int. Cl.

*C08L 67/02* (2006.01)
*C08K 3/04* (2006.01)

(Continued)

(52) U.S. Cl.

CPC .............. *C08L 67/02* (2013.01); *C08K 3/041* (2017.05); *C08K 7/06* (2013.01); *C08K 7/14* (2013.01);

(Continued)

(58) Field of Classification Search

CPC .. C08L 67/02; C08L 2201/02; C08L 2203/20; C08L 2205/035; C08L 25/06;

(Continued)

(56) References Cited

U.S. PATENT DOCUMENTS 6,231,788 B1 * 5/2001 Patel ........................ C08K 7/06 252/511
2013/0119320 A1 5/2013 Suyama et al.

(Continued)

FOREIGN PATENT DOCUMENTS

CN 106164151 A 11/2016
CN 106661319 A 5/2017

(Continued)

OTHER PUBLICATIONS

Japanese Office Action issued Nov. 12, 2024 in Japanese Patent Application No. 2021-099922 (with unedited computer-generated English translation). 16 pages.

(Continued)

*Primary Examiner* — Vladimir Magloire
*Assistant Examiner* — Naomi M Wolford
(74) *Attorney, Agent, or Firm* — Oblon, McClelland, Maier & Neustadt, L.L.P.

(57) ABSTRACT

A resin composition for electromagnetic wave absorber may have large absorbance of electromagnetic wave, small transmittance and reflectance of electromagnetic wave, and small variation of reflectance depending on frequency of electromagnetic wave. An electromagnetic wave absorber may use such a composition. The resin composition may contain 0.1

(Continued)

to 10.0 parts by mass of an electromagnetic wave absorbing material, per 100 parts by mass of a thermoplastic resin, demonstrating an absorbance at 76.5 GHz frequency of 40.0 to 100%, when formed to a size of 150 mm×150 mm×2 mm thick and determined by Equation (A); demonstrating a difference between the maximum and minimum value of reflectance in the range from 70 GHz to 80 GHz frequency of 20.0% or smaller, when formed to a size of 150 mm×150 mm×2 mm thick and determined by Equation (B); and being suited for use as an electromagnetic wave absorber.

21 Claims, 1 Drawing Sheet

(30) Foreign Application Priority Data

Oct. 5, 2020 (JP) ................................ 2020-168735
Nov. 18, 2020 (JP) ................................ 2020-191979
Dec. 28, 2020 (JP) ................................ 2020-219280
Dec. 28, 2020 (JP) ................................ 2020-219281
Dec. 28, 2020 (JP) ................................ 2020-219282

(51) Int. Cl.
*C08K 7/06* (2006.01)
*C08K 7/14* (2006.01)
*H05K 9/00* (2006.01)

(52) U.S. Cl.
CPC ........ *H05K 9/0081* (2013.01); *C08L 2201/02* (2013.01); *C08L 2203/20* (2013.01); *C08L 2205/035* (2013.01)

(58) Field of Classification Search
CPC .......... C08L 77/06; C08L 23/12; C08L 69/00; C08L 77/00; C08K 3/041; C08K 7/06; C08K 7/14; C08K 2201/019; C08K 3/016; C08K 3/16; H05K 9/0081; H05K 9/009
See application file for complete search history.

(56) References Cited

U.S. PATENT DOCUMENTS

2014/0093682 A1 4/2014 Nakamoto et al.
2015/0086790 A1 3/2015 Kim et al.
2016/0263840 A1 9/2016 Choi et al.
2017/0066907 A1 3/2017 Choi et al.
2017/0338000 A1 11/2017 Kim et al.
2018/0201751 A1 7/2018 Kim et al.
2018/0370197 A1 12/2018 Nagamune et al.
2019/0023875 A1 1/2019 Choi et al.
2020/0227833 A1 7/2020 Hiroi et al.
2021/0032461 A1 2/2021 Yamada et al.
2021/0371623 A1* 12/2021 Ueda ........................ C08K 3/04

FOREIGN PATENT DOCUMENTS

CN 108026117 A 5/2018
CN 110128799 A 8/2019
CN 111108153 A 5/2020
CN 111279808 A 6/2020
JP 2002-290094 A 10/2002
JP 2003-100147 A 4/2003
JP 2005-105015 A 4/2005
JP 2005-150461 A 6/2005
JP 2007-231219 A 9/2007
JP 2009-074072 A 4/2009
JP 2010-006856 A 1/2010
JP 2010-155993 A 7/2010
JP 2011-132281 A 7/2011
JP 2011-184681 A 9/2011
JP 2016-504470 A 2/2016
JP 2017-512847 A 5/2017
JP 2017-118073 A 6/2017
JP 2019-197048 A 11/2019
JP 2021-127403 A 9/2021
KR 20160087958 A * 7/2016 ............... C08K 3/04
KR 10-1798835 B1 11/2017
TW 201024352 A 7/2010
WO 2011/129024 A1 10/2011
WO 2012/169631 A1 12/2012
WO 2017/110096 A1 6/2017
WO 2019/017471 A1 1/2019
WO WO 2019/088062 A1 5/2019
WO WO 2019/167854 A1 9/2019
WO 2019/188545 A1 10/2019
WO WO 2019/235561 A1 12/2019

OTHER PUBLICATIONS

Japanese Third Party Submission issued Jul. 16, 2024 in Japanese Patent Application No. 2021-099922 (with unedited computer-generated English Translation), 11 pages.
Extended European Search Report issued on Oct. 18, 2023 in European Patent Application No. 21825998.4, 10 pages.
International Search Report (with English Translation) and Written Opinion issued Sep. 21, 2021, in PCT/JP2021/022815, 12 pages.
International Preliminary Report on Patentability and Written Opinion issued Dec. 13, 2022, in PCT/JP2021/022815 (with English Translation), 10 pages.
Decision of Rejection dated Apr. 1, 2025 Issued in the corresponding Japanese Patent Application No. 2021-099922 with its English machine translation, 10 pages.
Office Action dated May 7, 2025 Issued in the corresponding Japanese Patent Application No. 2021-099921 with its English machine translation, 10 pages.
Office Action dated Jun. 17, 2025 issued in the corresponding Malaysian Patent Application No. PI 2022006972, 4 pages.
Office Action dated Jun. 24, 2025 issued in the corresponding Japanese Patent Application No. 2020-219280 with its machine English translation, 8 pages.
Office Action dated Jun. 24, 2025 issued in the corresponding Japanese Patent Application No. 2020-219281 with its machine English translation, 6 pages.
Office Action dated Jun. 24, 2025 issued in the corresponding Japanese Patent Application No. 2020-219282 with its machine English translation, 6 pages.
International Search Report and Written Opinion dated Aug. 31, 2021, in International Application No. PCT/JP2021/022814 (14 pages), citing documents 7, 8, 9, 10, 11 and 12.
International Preliminary Report on Patentability of Chapter 1 dated Dec. 13, 2022, in International Application No. PCT/JP2021/022814 (16 pages), citing documents 7, 8, 9, 10, 11 and 12.
Office Action dated Aug. 17, 2023, in Chinese Patent Application No. 202180038911.1 with machine English translation (p. 18), citing document 14.
Extended European Search Report dated Oct. 18, 2023, in European Patent Application No. 21825153.6 (9 pages), citing documents citing documents 7, 8, 9, 10, 11 and 12.
Office Action dated May 7, 2024, in Chinese Patent Application No. 202180038911.1 with machine English translation (13 pages), citing documents 13 and 14.
Decision of Rejection dated Sep. 23, 2024, in Chinese Patent Application No. 202180038911.1 with machine English translation (16 pages), citing documents 13 and 14.
Office Action dated Dec. 27, 2024, in Taiwanese Patent Application No. 110121909 with English translation (19 pages), citing documents 16, 17 and 18.
Office Action dated Dec. 31, 2024, in Vietnamese Patent Application No. 1-2023-00173 with machine English translation (4 pages).
Decision of Rejection dated May 28, 2025, in Taiwanese Patent Application No. 110121909 with English translation (8 pages), citing documents 16, 17 and 18.

(56) References Cited

OTHER PUBLICATIONS

Office Action dated Jul. 9, 2025, in Malaysian Patent Application No. PI 2022006973 (5 pages), citing documents 7, 8, 9 and 11.
Office Action dated Aug. 22, 2025, in Vietnamese Patent Application No. 1-2023-00173 with English translation (6 pages).
Office Action mailed Nov. 20, 2025, in co-pending U.S. Appl. No. 18/001,812.
Decision of Refusal dated Sep. 24, 2025, in Japanese Patent Application No. 2021-099921 with machine English translation (6 pages).

* cited by examiner

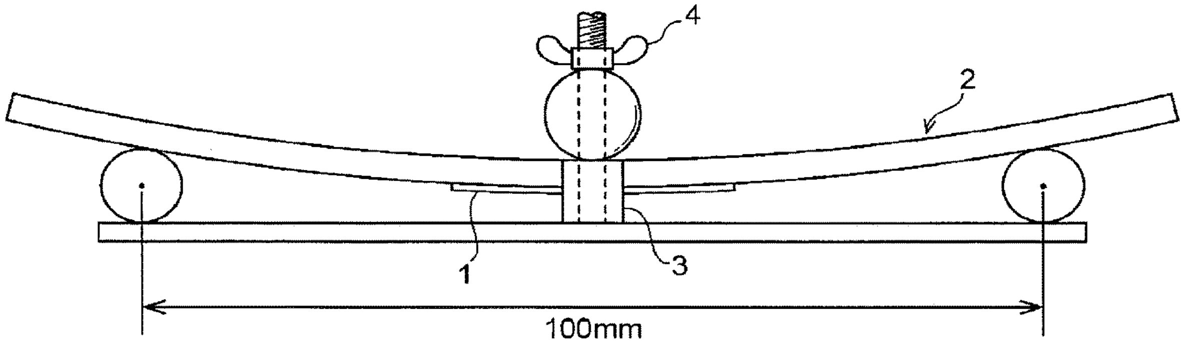
4
2
1
3
100mm

RESIN COMPOSITION AND ELECTROMAGNETIC WAVE ABSORBER

CROSS-REFERENCE TO RELATED APPLICATIONS

The present application is the national stage of international application PCT/JP2021/022815, filed on Jun. 16, 2021, and claims the benefit of the filing date of Japanese Appl. No. 2020-104511, filed on Jun. 17, 2020; Japanese Appl. No. 2020-109525, filed on Jun. 25, 2020; Japanese Appl. No. 2020-168735, filed on Oct. 5, 2020; Japanese Appl. No. 2020-191979, filed on Nov. 18, 2020; Japanese Appl. No. 2020-219280, filed on Dec. 28, 2020; Japanese Appl. No. 2020-219281, filed on Dec. 28, 2020; and Japanese Appl. No. 2020-219282, filed on Dec. 28, 2020.

TECHNICAL FIELD

This invention relates to a resin composition for electromagnetic wave absorber, and an electromagnetic wave absorber.

BACKGROUND ART

Millimeter-wave radar detects presence of an obstacle, or distance or speed relative to an object, by emitting radio wave in the millimeter waveband with 1 to 10 mm wavelength, at a frequency of 30 to 300 GHz, particularly at 60 to 90 GHZ, and by detecting a reflected wave returned back after colliding on the object. The millimeter-wave radar has been investigated for use in a wide range of fields, including automotive anti-collision sensor, autonomous driving system, road information service system, security system, and medical/care device.

Known examples of resin composition used for such millimeter-wave radar have been described in Patent Literature 1. On the other hand, Patent Literature 2 discloses a multi-functional resin composition applicable for the purpose of shielding electromagnetic interference or shielding of radio frequency interference.

CITATION LIST

Patent Literature

[Patent Literature 1] JP 2019-197048 A
[Patent Literature 2] JP 2010-155993 A

SUMMARY OF THE INVENTION

Technical Problem

SUMMARY OF THE INVENTION

Technical Problem

Now, the millimeter-wave radar suffers from noise ascribed not only to transmissive electromagnetic wave, but also to reflective electromagnetic wave, causing malfunction. This has increased demands for a material demonstrating large absorbance of electromagnetic wave, as well as demonstrating small transmittance and small reflectance of electromagnetic wave. Large variation of reflectance depending on frequency of electromagnetic wave can affect the stability and productivity. This invention is aimed at solving the problems, wherein an object of which is to provide a resin composition for electromagnetic wave absorber having large absorbance of electromagnetic wave, small transmittance and small reflectance of electromagnetic wave, as well as demonstrating small variation of reflectance depending on frequency of electromagnetic wave; and an electromagnetic wave absorber.

Solution to Problem

The present inventors conducted research to address the above-mentioned problems, and as a result, the problems described above are solved by the following means.

<1-1> A resin composition containing a thermoplastic resin and an electromagnetic wave absorbing material, demonstrating an absorbance at 76.5 GHz frequency of 40.0 to 100%, when formed to a size of 150 mm×150 mm×2 mm thick and determined by Equation (A); demonstrating a difference between a maximum value and a minimum value of reflectance in the range from 70 GHz to 80 GHZ frequency of 20.0% or smaller, when formed to a size of 150 mm×150 mm×2 mm thick and determined by Equation (B); and being intended for use as an electromagnetic wave absorber:

$$\text{Absorbance (\%)} = 100 - \left(\frac{1}{10^{-R/10}} \times 100 + \frac{1}{10^{-T/10}} \times 100\right) \quad \text{Equation (A)}$$

(in Equation (A), R represents return loss measured by the free space method, and T represents transmission attenuation measured by the free space method), $$\text{Reflectance (\%)} = \frac{1}{10^{-R/10}} \times 100 \quad \text{Equation (B)}$$

(in Equation (B), R represents return loss measured by the free space method).

<1-2> The resin composition of <1-1>, wherein the electromagnetic wave absorbing material is a carbon-containing electromagnetic wave absorbing material.

<1-3> The resin composition of <1-1> or <1-2>, containing 0.1 to 10.0 parts by mass of a carbon nanotube, per 100 parts by mass of the thermoplastic resin, demonstrating an absorbance at 76.5 GHz frequency of 40.0 to 100%, when formed to a size of 150 mm×150 mm×2 mm thick and determined by Equation (A); demonstrating a difference between a maximum value and a minimum value of reflectance in the range from 70 GHz to 80 GHz frequency of 20.0% or smaller, when formed to a size of 150 mm×150 mm×2 mm thick and determined by Equation (B); and being intended for use as an electromagnetic wave absorber:

<1-4> The resin composition of any one of <1-1> to <1-3>, further containing 10 to 100 parts by mass of a glass fiber, per 100 parts by mass of the thermoplastic resin.

<1-5> The resin composition of <1-4>, wherein the electromagnetic wave absorbing material and the glass fiber follow a mass proportion (electromagnetic wave absorbing material/glass fiber) of 0.01 to 0.30.

<1-6> The resin composition of any one of <1-1> to <1-5>, further containing 0.01 to 5.0 parts by mass of a reactive compound, per 100 parts by mass of the thermoplastic resin.

<1-7> The resin composition of any one of <1-1> to <1-6>, wherein the thermoplastic resin contains a polybutylene terephthalate resin.

<1-8> The resin composition of <1-7>, further containing 1.0 to 75 parts by mass of a polycarbonate resin, per 100 parts by mass of the polybutylene terephthalate resin.

<1-9> The resin composition of <1-7>, further containing 1.0 to 60 parts by mass of a polystyrene-based resin, per 100 parts by mass of the polybutylene terephthalate resin.

<1-10> The resin composition of <1-7>, further containing 1.0 to 75 parts by mass of a polycarbonate resin, and 1.0 to 60 parts by mass of a polystyrene-based resin, per 100 parts by mass of the polybutylene terephthalate resin.

<1-11> The resin composition of any one of <1-1> to <1-6>, wherein the thermoplastic resin contains a polypropylene resin.

<1-12> The resin composition of any one of <1-1> to <1-6>, wherein the thermoplastic resin contains a polyamide resin.

<1-13> The resin composition of any one of <1-1> to <1-12>, wherein the electromagnetic wave absorbing material contains a multi-layered carbon nanotube.

<1-14> The resin composition of any one of <1-1> to <1-13>, wherein the resin composition contains no carbon fiber, or has a content of carbon fiber of less than 3% by mass.

<1-15> The resin composition of any one of <1-1> to <1-14>, demonstrating a reflectance at 76.5 GHz frequency of 40.0% or smaller, when formed to a size of 150 mm×150 mm×2 mm thick and determined by Equation (B):

$$\text{Reflectance (\%)} = \frac{1}{10^{-R/10}} \times 100 \qquad \text{Equation (B)}$$

(in Equation (B), R represents return loss measured by the free space method).

<1-16> The resin composition of any one of <1-1> to <1-15>, demonstrating a transmittance at 76.5 GHz frequency of 15.0% or smaller, when formed to a size of 150 mm×150 mm×2 mm thick and determined by Equation (C):

$$\text{Transmittance (\%)} = \frac{1}{10^{-T/10}} \times 100 \qquad \text{Equation (C)}$$

(in Equation (C), T represents transmission attenuation measured by the free space method).

<1-17> A resin composition containing a thermoplastic resin, demonstrating an absorbance at 76.5 GHz frequency of 60.0% or larger, when formed to a size of 150 mm×150 mm×2 mm thick and determined by Equation (A); demonstrating a reflectance at 76.5 GHz frequency of 30.0% or smaller, when formed to a size of 150 mm×150 mm×2 mm thick and determined by Equation (B); demonstrating a transmittance of 10.0% or smaller at 76.5 GHz frequency, when formed to a size of 150 mm×150 mm×2 mm thick and determined by Equation (C); and being intended for use as an electromagnetic wave absorber:

$$\text{Absorbance (\%)} = 100 - \left( \frac{1}{10^{-R/10}} \times 100 + \frac{1}{10^{-T/10}} \times 100 \right) \qquad \text{Equation (A)}$$

(in Equation (A), R represents return loss measured by the free space method, and T represents transmission attenuation measured by the free space method), $$\text{Reflectance (\%)} = \frac{1}{10^{-R/10}} \times 100 \qquad \text{Equation (B)}$$

(in Equation (B), R represents return loss measured by the free space method), and $$\text{Transmittance (\%)} = \frac{1}{10^{-T/10}} \times 100 \qquad \text{Equation (C)}$$

(in Equation (C), T represents transmission attenuation measured by the free space method).

<1-18> The resin composition of any one of <1-1> to <1-17>, further containing a flame retardant.

<1-19> The resin composition of <1-18>, wherein the flame retardant is a bromine-containing flame retardant.

<1-20> An electromagnetic wave absorber formed of the resin composition described in any one of <1-1> to <1-19>.

<2-1> A resin composition containing a crystalline thermoplastic resin, a carbon nanotube, and a flame retardant, demonstrating an absorbance at 76.5 GHz frequency, when formed to a thickness of 2 mm and determined by Equation (A), of 40.0 to 100%:

$$\text{Absorbance (\%)} = 100 - \left( \frac{1}{10^{-R/10}} \times 100 + \frac{1}{10^{-T/10}} \times 100 \right) \qquad \text{Equation (A)}$$

(in Equation (A), R represents return loss measured by the free space method, and T represents transmission attenuation measured by the free space method).

<2-2> The resin composition of <2-1>, further containing a flame retardant auxiliary.

<2-3> The resin composition of <2-1> or <2-2>, further containing a reinforcing material.

<2-4> The resin composition of <2-3>, wherein the reinforcing material contains a glass fiber.

<2-5> The resin composition of any one of <2-1> to <2-4>, wherein the crystalline thermoplastic resin contains a polybutylene terephthalate resin.

<2-6> The resin composition of any one of <2-1> to <2-5>, containing 0.1 to 10.0 parts by mass of the carbon nanotube, per 100 parts by mass of the crystalline thermoplastic resin.

<2-7> The resin composition of any one of <2-1> to <2-6>, wherein the carbon nanotube contains a multi-layered carbon nanotube.

<2-8> The resin composition of any one of <2-1> to <2-7>, being rated to be V-0 or V-1, when formed into a 0.8 mm-thick test specimen, and measured by the UL94 combustion test.

<2-9> A formed article formed of the resin composition described in any one of <2-1> to <2-8>.

<2-10> An electromagnetic wave absorber formed of the resin composition described in any one of <2-1> to <2-8>.

<3-1> A resin composition containing a thermoplastic resin, a carbon nanotube, and a bromine-containing flame retardant, with a mass proportion CNT/Br of the carbon nanotube (CNT) an d bromine atom (Br) contained in the bromine-containing flame retardant, being 0.01 to 0.40.

<3-2> The resin composition of <3-1>, further containing an antimony compound.

<3-3> The resin composition of <3-1> or <3-2>, further containing a reinforcing material.

<3-4> The resin composition of <3-3>, wherein the reinforcing material contains a glass fiber.

<3-5> The resin composition of any one of <3-1> to <3-4>, wherein the thermoplastic resin contains a polybutylene terephthalate resin.

<3-6> The resin composition of any one of <3-1> to <3-5>, containing 0.1 to 10.0 parts by mass of the carbon nanotube, per 100 parts by mass of the thermoplastic resin.

<3-7> The resin composition of any one of <3-1> to <3-6>, wherein the carbon nanotube contains a multilayered carbon nanotube.

<3-8> The resin composition of any one of <3-1> to <3-7>, being rated to be V-0 or V-1, when formed into a 0.8 mm-thick test specimen, and measured by the UL94 combustion test.

<3-9> The resin composition of any one of <3-1> to <3-8>, demonstrating electromagnetic wave absorptivity.

<3-10> The resin composition of any one <3-1> to <3-9>, demonstrating an absorbance at 76.5 GHz frequency, when formed to a thickness of 2 mm and determined by Equation (A), of 40.0 to 100%:

$$\text{Absorbance}\,(\%) = 100 - \left(\frac{1}{10^{-R/10}} \times 100 + \frac{1}{10^{-T/10}} \times 100\right) \qquad \text{Equation (A)}$$

(in Equation (A), R represents return loss measured by the free space method, and T represents transmission attenuation measured by the free space method).

<3-11> A formed article formed of the resin composition described in any one of <3-1> to <3-10>.

<3-12> An electromagnetic wave absorber formed of the resin composition described in any one of <3-1> to <3-10>.

<4-1> A resin composition containing a thermoplastic resin, a reinforcing fiber, a carbon nanotube, and a flame retardant, demonstrating an absorbance at 76.5 GHz frequency, when formed to a thickness of 2 mm and determined by Equation (A), of 40.0 to 100%:

$$\text{Absorbance}\,(\%) = 100 - \left(\frac{1}{10^{-R/10}} \times 100 + \frac{1}{10^{-T/10}} \times 100\right) \qquad \text{Equation (A)}$$

(in Equation (A), R represents return loss measured by the free space method, and T represents transmission attenuation measured by the free space method).

<4-2> The resin composition of <4-1>, further containing a flame retardant auxiliary.

<4-3> The resin composition of <4-1> or <4-2>, wherein the flame retardant contains a bromine-containing flame retardant.

<4-4> The resin composition of any one of <4-1> to <4-3>, wherein the reinforcing fiber contains a glass fiber.

<4-5> The resin composition of any one of <4-1> to <4-4>, wherein the thermoplastic resin contains a polybutylene terephthalate resin.

<4-6> The resin composition of any one of <4-1> to <4-5>, containing 0.1 to 10.0 parts by mass of the carbon nanotube, per 100 parts by mass of the thermoplastic resin.

<4-7> The resin composition of any one of <4-1> to <4-6>, wherein the carbon nanotube contains a multilayered carbon nanotube.

<4-8> The resin composition of any one of <4-1> to <4-7>, being rated to be V-0 or V-1, when formed into a 0.8 mm-thick test specimen, and measured by the UL94 combustion test.

<4-9> A formed article formed of the resin composition described in any one of <4-1> to <4-8>.

<4-10> An electromagnetic wave absorber formed of the resin composition described in any one of <4-1> to <4-8>.

Advantageous Effects of Invention

This invention is the first to provide a resin composition for electromagnetic wave absorber having large absorbance of electromagnetic wave, small transmittance and small reflectance of electromagnetic wave, as well as demonstrating small variation of reflectance depending on frequency of electromagnetic wave; and an electromagnetic wave absorber.

BRIEF DESCRIPTION OF DRAWINGS

FIG. 1 A schematic drawing illustrating a jig capable of applying three-point bending load and a formed article set thereon, for evaluating chemical resistance in Examples.

DESCRIPTION OF EMBODIMENTS

Embodiments for carrying out the invention (simply referred to as "this embodiment", hereinafter) will be detailed below. The embodiments below are merely illustrative, so that this invention is not limited solely to these embodiments.

Note that all numerical ranges given in this patent specification, with "to" preceded and succeeded by numerals, are used to represent the ranges including these numerals respectively as the lower and upper limit values.

Various physical properties and characteristic values mentioned herein are those demonstrated at 23° C., unless otherwise specifically noted.

Weight-average molecular weight and number-average molecular weight mentioned herein are polystyrene equivalent values measured by GPC (gel permeation chromatography), unless otherwise specifically noted.

Return loss and transmission attenuation mentioned herein are in dB (decibel).

A resin composition of this embodiment contains a thermoplastic resin and an electromagnetic wave absorbing material, demonstrates an absorbance at 76.5 GHz frequency of 40.0 to 100%, when formed to a size of 150 mm×150 mm×2 mm thick and determined by Equation (A);

demonstrates a difference between a maximum value and a minimum value of reflectance in the range from 70

GHz to 80 GHZ frequency of 20.0% or smaller, when formed to a size of 150 mm×150 mm×2 mm thick and determined by Equation (B); and is intended for use as an electromagnetic wave absorber:

$$\text{Absorbance}\,(\%) = 100 - \left(\frac{1}{10^{-R/10}} \times 100 + \frac{1}{10^{-T/10}} \times 100\right) \quad \text{Equation (A)}$$

(in Equation (A), R represents return loss measured by the free space method, and T represents transmission attenuation measured by the free space method), $$\text{Reflectance}\,(\%) = \frac{1}{10^{-R/10}} \times 100 \quad \text{Equation (B)}$$

(in Equation (B), R represents return loss measured by the free space method).

With such structure, the obtainable resin composition for electromagnetic wave absorber may have large absorbance of electromagnetic wave, small transmittance and small reflectance of electromagnetic wave, as well as demonstrate small variation of reflectance depending on frequency of electromagnetic wave.

<Thermoplastic Resin>

The resin composition of this embodiment contains a thermoplastic resin.

The thermoplastic resin preferably used in this embodiment is exemplified by polyester resin (thermoplastic polyester resin); polyamide resin; polycarbonate resin; polystyrene-based resin; polyolefin resins such as polyethylene resin, polypropylene resin, and cyclic cycloolefin resin; polyacetal resin; polyimide resin; polyether imide resin; polyurethane resin; polyphenylene ether resin; polyphenylene sulfide resin; polysulfone resin; and polymethacrylate resin. The resin composition more preferably contains at least one of polyolefin resin (preferably polypropylene resin), polycarbonate resin, polyphenylene ether resin, polyester resin or polyamide resin; more preferably contains at least one of polycarbonate resin, polyphenylene ether resin, polyester resin or polyamide resin; and even more preferably contains polybutylene terephthalate resin.

One preferred example of the thermoplastic resin in this embodiment contains a polyester resin (preferably, polybutylene terephthalate resin), wherein 90% by mass or more (preferably 95% by mass or more) of the resin composition is ascribed to the polyester resin (preferably, polybutylene terephthalate resin).

Another preferred example of the thermoplastic resin in this embodiment contains a polycarbonate resin, wherein 90% by mass or more (preferably 95% by mass or more) of the resin composition is ascribed to the polycarbonate resin.

Still another preferred example of the thermoplastic resin in this embodiment contains a polyphenylene ether resin, wherein 90% by mass or more (preferably 95% by mass or more) of the resin composition is ascribed to the polyphenylene ether resin.

One preferred example of the thermoplastic resin in this embodiment contains a polyolefin resin (preferably, polypropylene resin), wherein 90% by mass or more (preferably 95% by mass or more) of the resin composition is ascribed to the polyolefin resin (preferably, polypropylene resin).

Another preferred example of the thermoplastic resin in this embodiment contains a polyamide resin, wherein 90% by mass or more (preferably 95% by mass or more) of the resin composition is ascribed to the polyamide resin. The polyamide resin in this embodiment is exemplified by xylylenediamine-based polyamide resin and aliphatic polyamide resin (preferably polyamide 1010) described later.

Another preferred example of the thermoplastic resin in this embodiment contains a crystalline resin (preferably at least either polyester resin or polyamide resin, more preferably polyester resin, and even more preferably polybutylene terephthalate resin), wherein 90% by mass or more (preferably 95% by mass or more) of the resin composition is ascribed to the crystalline resin. The crystalline thermoplastic resin refers to a resin that demonstrates a definite melting point.

The resin composition of this embodiment may alternatively be a polymer alloy obtainable by blending two or more kinds of thermoplastic resin. Blending of two or more kinds of thermoplastic resin normally produces a sea-island structure without showing full compatibility. Since the electromagnetic wave absorbing material (preferably carbon nanotube) is less likely to reside in the island domain, so that the resin composition or an electromagnetic wave absorber will consequently have a reduced region where the electromagnetic wave absorbing material can reside, thus making it possible to effectively achieving various performances including electromagnetic wave absorbance, even with a small amount of blending of electromagnetic wave absorbing material.

An exemplary mode typically relates to blending of the polybutylene terephthalate resin with the polycarbonate resin and/or polystyrene resin.

Modes of blending of resin composition in this embodiment are preferably as follows.

A first mode of blending relates to a mode that contains, per 100 parts by mass of polybutylene terephthalate resin, 1.0 to 75 parts by mass of the polycarbonate resin. With the polycarbonate resin blended therein, the obtainable electromagnetic wave absorber may be effectively suppressed from warping. In the first mode of blending, preferably 90% by mass or more of a resin component contained in the resin composition is ascribed to the polybutylene terephthalate resin and the polycarbonate resin, wherein the percentage is more preferably 95% by mass or larger, and even more preferably 99% by mass or larger.

The lower limit value of the content of the polycarbonate resin in the first mode of blending is preferably 10 parts by mass or above, more preferably 20 parts by mass or above, even more preferably 40 parts by mass or above, yet more preferably 45 parts by mass or above, and furthermore preferably 50 parts by mass or above. At or above the lower limit value, the formed article will tend to have reduced warpage. The upper limit value of the content of the polycarbonate resin in the first mode of blending is preferably 70 parts by mass or below, and more preferably 65 parts by mass or below. At or below the upper limit value, the chemical resistance and hydrolysis resistance tend to further improve.

The first mode of blending may use only one kind, or two or more kinds of polycarbonate resin. When two or more kinds are used, the total content preferably falls within any of the aforementioned ranges.

A second mode of blending relates to a mode that contains, per 100 parts by mass of polybutylene terephthalate resin, 1.0 to 60 parts by mass of a polystyrene-based resin (preferably AS resin). With the polystyrene-based resin blended therein, the obtainable electromagnetic wave absorber will be effectively suppressed from warping. In the second mode of blending, preferably 90% by mass or more of a resin component contained in the resin composition is ascribed to the polybutylene terephthalate resin and the polystyrene-based resin (preferably AS resin), wherein the percentage is more preferably 95% by mass or larger, and even more preferably 99% by mass or larger.

The lower limit value of the content of the polystyrene-based resin (preferably AS resin) in the second mode of blending is preferably 5 parts by mass or above, more preferably 10 parts by mass or above, even more preferably 20 parts by mass or above, yet more preferably 25 parts by mass or above, and furthermore 30 parts by mass or more. At or above the lower limit value, the formed article will tend to further reduce the warpage. The upper limit value of the content of the polystyrene-based resin (preferably AS resin) in the second mode of blending is preferably 90 parts by mass or below, and more preferably 80 parts by mass or below. At or below the upper limit value, an effect called chemical resistance tends to further improve.

The second mode of blending may use only one kind of, or two or more kinds of polystyrene-based resin. When two or more kinds are used, the total content preferably falls within any of the aforementioned ranges.

A third mode of blending relates to a mode that contains, per 100 parts by mass of polybutylene terephthalate resin, 1.0 to 75 parts by mass of a polycarbonate resin, and, 1.0 to 60 parts by mass of a polystyrene-based resin (preferably HIPS). With the polystyrene-based resin and the polycarbonate resin blended therein, the obtainable electromagnetic wave absorber will be effectively suppressed from warping. In the third mode of blending, preferably 90% by mass or more of the resin component contained in the resin composition is ascribed to the polybutylene terephthalate resin and the polycarbonate resin and the polystyrene-based resin (preferably, HIPS), wherein the percentage is more preferably 95% by mass or larger, and even more preferably 99% by mass or larger.

The lower limit value of the content of the styrene-based resin (preferably, HIPS) in the third mode of blending is preferably 10 parts by mass or above, more preferably 20 parts by mass or above, even more preferably 30 parts by mass or above, yet more preferably 35 parts by mass or above, and furthermore preferably 38 parts by mass or above. At or above the lower limit value, the formed article will tend to further reduce the warpage. The upper limit value of the content of the styrene-based resin in the third mode of blending is preferably 70 parts by mass or below, more preferably 65 parts by mass or below, even more preferably 60 parts by mass or below, yet more preferably 55 parts by mass or below, and furthermore preferably 50 parts by mass or below. At or below the upper limit value, the chemical resistance tends to further improve.

The lower limit value of the content of the polycarbonate resin in the third mode of blending is preferably 4 parts by mass or above, more preferably 8 parts by mass or above, even more preferably 10 parts by mass or above, and yet more preferably 12 parts by mass or above. At or above the lower limit value, the formed article will tend to further reduce the warpage. The upper limit value of the content of the polycarbonate resin in the third mode of blending is preferably 50 parts by mass or below, more preferably 40 parts by mass or below, even more preferably 30 parts by mass or below, yet more preferably 20 parts by mass, and furthermore preferably 18 parts by mass or below. At or below the upper limit value, the chemical resistance and hydrolysis resistance tend to further improve.

In the third mode of blending, mass proportion of the polycarbonate resin and the styrene resin is preferably 1: (2.0 to 4.0), and more preferably 1: (2.5 to 3.5). With such mass proportion, the formed article will tend to suppress the warpage, and to further improve the mechanical strength.

The third mode of blending may use only one kind of, or two or more kinds of each of the styrene-based resin and the polycarbonate resin. When two or more kinds are used, the total content preferably falls within any of the aforementioned ranges.

A fourth mode of blending in this embodiment relates to a mode that contains a polybutylene terephthalate resin (PBT) and a polyethylene terephthalate resin (PET). The fourth mode of blending preferably contains 10 to 90% by mass of PBT and 90 to 10% by mass of PET. Note that, in the first mode of blending, the total of PBT and PET, from among the resin components contained in the resin composition, preferably falls in the range from 90 to 100% by mass, without exceeding 100% by mass.

A fifth mode of blending in this embodiment relates to a mode that contains a polybutylene terephthalate resin (PBT) and a polyamide resin (PA). The fifth mode of blending preferably contains 10 to 90% by mass of PBT and 90 to 10% by mass of PA. Note that, in the second mode of blending, the total of PBT and PA, from among the resin components contained in the resin composition, preferably falls in the range from 90 to 100% by mass, without exceeding 100% by mass. The polyamide resin is exemplified by aliphatic polyamide resin. Polyamide 6 and polyamide 66 are preferred.

A sixth mode of blending in this embodiment relates to a mode that contains a polybutylene terephthalate resin (PBT) and a polyethylene resin (PE). The sixth mode of blending preferably contains 10 to 90% by mass of PBT and 90 to 10% by mass of PE. Note that, in the third mode of blending, the total of PBT and PE, from among the resin components contained in the resin composition, preferably falls in the range from 90 to 100% by mass, without exceeding 100% by mass.

The resin composition of this embodiment according to the fourth to sixth modes of blending may contain an amorphous resin, without departing from the spirit of this invention. The content of the amorphous resin, when contained in the resin composition of this embodiment, is preferably 0.1 to 40% by mass of the crystalline resin, may be 0.1 to 10% by mass, and may also be 0.1 to 5% by mass.

The individual thermoplastic resins will be detailed below.

The individual thermoplastic resins will be detailed below.

«Polyester Resin»

The polyester resin used herein may be any of known thermoplastic polyester resins, which is preferably polyethylene terephthalate resin or polybutylene terephthalate resin, and preferably contains at least polybutylene terephthalate resin.

The polybutylene terephthalate resin used for the resin composition of this embodiment has a structure in which terephthalic acid unit and 1,4-butanediol unit form an ester bond in between, and includes not only such polybutylene terephthalate resin (homopolymer), but also polybutylene terephthalate copolymer that contains a copolymer component other than the terephthalic acid unit and the 1,4-butanediol unit; and mixture of the homopolymer and the polybutylene terephthalate copolymer.

The polybutylene terephthalate resin may contain one kind, or two or more kinds of dicarboxylic acid unit other than terephthalic acid.

Such other dicarboxylic acid is specifically exemplified by aromatic dicarboxylic acids such as isophthalic acid, orthophthalic acid, 1,5-naphthalenedicarboxylic acid, 2,5-naphthalenedicarboxylic acid, 2,6-naphthalenedicarboxylic acid, biphenyl-2,2'-dicarboxylic acid, biphenyl-3,3'-dicarboxylic acid, biphenyl-4,4'-dicarboxylic acid, bis(4,4'-carboxyphenyl) methane, anthracene dicarboxylic acid, and 4,4'-diphenyl ether dicarboxylic acid; alicyclic dicarboxylic acids such as 1,4-cyclohexanedicarboxylic acid, and 4,4'-dicyclohexyldicarboxylic acid; and aliphatic dicarboxylic acids such as adipic acid, sebacic acid, azelaic acid, and dimer acid.

In the polybutylene terephthalate resin used in this embodiment, the terephthalic acid unit preferably accounts for 80 mol % or more of all dicarboxylic acid units, and more preferably accounts for 90 mol % or more.

One kind of, or two or more kinds of other diol unit may be contained as the diol unit, besides 1,4-butanediol.

Such other diol unit is specifically exemplified by aliphatic or alicyclic diols having 2 to 20 carbon atoms, and bisphenol derivatives. Specific examples include ethylene glycol, propylene glycol, 1,5-pentanediol, 1,6-hexanediol, neopentyl glycol, decamethylene glycol, cyclohexanedimethanol, 4,4'-dicyclohexylhydroxymethane, 4,4'-dicyclohexylhydroxypropane, and bisphenol A-ethylene oxide adduct. Again besides the aforementioned bifunctional monomers, also usable in a small amount are trifunctional monomers such as trimellitic acid, trimesic acid, pyromellitic acid, pentaerythritol, trimethylolpropane for the purpose of introducing a branching structure; and monofunctional compound such as fatty acid for controlling molecular weight.

In the polybutylene terephthalate resin used in this embodiment, the 1,4-butanediol unit preferably accounts for 80 mol % or more of all diol units, and more preferably accounts for 90 mol % or more.

The polybutylene terephthalate resin is preferably a polybutylene terephthalate homopolymer obtainable by polycondensing terephthalic acid with 1,4-butanediol, as described previously. Also acceptable is the polybutylene terephthalate copolymer that contains, as the carboxylic acid unit, one or more kind of dicarboxylic acid other than terephthalic acid, and/or contains, as the diol unit, one or more kind of diol other than 1,4-butanediol. In a case where the polybutylene terephthalate resin were modified by copolymerization, preferred examples of such copolymer include polyester ether resin copolymerized with polyalkylene glycols, specifically with polytetramethylene glycol; polybutylene terephthalate resin copolymerized with dimer acid; and polybutylene terephthalate resin copolymerized with isophthalic acid. Among them, polyester ether resin copolymerized with polytetramethylene glycol is preferably used.

Note that these copolymers have an amount of copolymerization of 1 mol % or more, and less than 50 mol %, relative to all segments of the polybutylene terephthalate resin. In particular, the amount of copolymerization is preferably 2 mol % or more and less than 50 mol %, even more preferably 3 to 40 mol %, and yet more preferably 5 to 20 mol %. Such proportion of copolymerization is preferred since the fluidity, toughness, and tracking resistance are more likely to improve.

Terminal carboxy group content of the polybutylene terephthalate resin, which may be subjected to proper selection and decision, is typically 60 eq/ton or less, preferably 50 eq/ton or less, and even more preferably 30 eq/ton or less. At or below these upper limit values, the alkali resistance and hydrolysis resistance tend to improve. The lower limit value of the terminal carboxy group content, although not specifically limited, is normally 10 eq/ton or more, taking productivity of the polybutylene terephthalate resin into consideration.

Note that the terminal carboxy group content of the polybutylene terephthalate resin is a measured value obtainable by dissolving 0.5 g of the polybutylene terephthalate resin into 25 mL of benzyl alcohol, and titrating the solution with a 0.01 mol/L sodium hydroxide solution in benzyl alcohol. Method for controlling the terminal carboxy group content is freely selectable from known methods, including a method for controlling polymerization conditions such as loading ratio of raw materials, polymerization temperature, and decompression scheme; and a method of reacting with a terminal blocker.

The polybutylene terephthalate resin preferably has an intrinsic viscosity of 0.5 to 2 dL/g. From the viewpoint of the formability and mechanical property, those having an intrinsic viscosity within the range from 0.6 to 1.5 dL/g are more preferred. With the intrinsic viscosity adjusted to 0.5 dL/g or larger, the obtainable resin composition will tend to have further improved mechanical strength. Meanwhile, at or below 2 dL/g, the resin composition will tend to have further improved fluidity, thereby improving the formability.

Note that the intrinsic viscosity of the polybutylene terephthalate resin is a value measured in a 1:1 (ratio by mass) mixed solvent of tetrachloroethane and phenol, at 30° C.

The polybutylene terephthalate resin may be produced by batch-type or continuous melt polymerization of a dicarboxylic acid component mainly composed of terephthalic acid or ester derivative thereof, with a diol component mainly composed of 1,4-butanediol. The melt polymerization, after producing a low-molecular-weight polybutylene terephthalate resin, may be followed by solid phase polymerization under nitrogen gas flow or under reduced pressure, to increase the degree of polymerization (or molecular weight) up to a desired level.

The polybutylene terephthalate resin is preferably obtained by continuous melt polymerization of a dicarboxylic acid component mainly composed of terephthalic acid, with a diol component mainly composed of 1,4-butanediol.

Catalyst used for the esterification may be any of known substances including titanium compound, tin compound, magnesium compound, and calcium compound. Among them, particularly preferred is titanium compound. The titanium compound as an esterification catalyst is exemplified by titanium alcoholate such as tetramethyl titanate, tetraisopropyl titanate, and tetrabutyl titanate; and titanium phenolate such as tetraphenyl titanate.

The polyester resin other than those described above may be understood referring to the description in paragraphs to of JP 2010-174223 A, the content of which is incorporated herein by reference.

Content of the polybutylene terephthalate resin in the resin composition of this embodiment, when such polybutylene terephthalate resin is contained in the resin composition of this embodiment, is preferably 30% by mass or more in the resin composition, and is more preferably 35% by mass or more, even more preferably 37% by mass or more, and yet more preferably 40% by mass or more. At or above the lower limit value, the chemical resistance tends to further improve. Meanwhile, the content of the polybutylene terephthalate resin, when contained in the resin composition, is preferably 80% by mass or less, more preferably 75% by mass or less, even more preferably 72% by mass or less, yet more preferably 66% by mass or less, furthermore preferably 60% by mass or less, and may even be 55% by mass or less, 50% by mass or less, and 47% by mass or less. At or below the upper limit value, the formed article will tend to further effectively reduce the warpage.

The resin composition of this embodiment may contain one kind of, or two or more kinds of the polybutylene terephthalate resin. When two or more kinds are contained, the total content preferably falls within any of the aforementioned ranges.

«Polycarbonate Resin»

The polycarbonate resin is an optionally branched homopolymer or copolymer, obtainable by reacting dihydroxy compound, occasionally together with a small amount of polyhydroxy compound, with phosgene or carbonic acid diester. Method for producing the polycarbonate resin is not specifically limited, so that any of polycarbonate resins produced by known methods including phosgene method (interfacial polymerization) or fusion method (transesterification) may be used.

The dihydroxy compound used as the raw material is preferably an aromatic dihydroxy compound, which is exemplified by 2,2-bis(4-hydroxyphenyl) propane (or, bisphenol A), tetramethylbisphenol A, bis(4-hydroxyphenyl)-p-diisopropyl benzene, hydroquinone, resorcinol, and 4,4-dihydroxybiphenyl. Bisphenol A is preferred. Also the aromatic dihydroxy compound, having one or more tetraalkylphosphonium sulfonates bound thereto, may be used.

Among the aforementioned polycarbonate resins, preferred is aromatic polycarbonate resin derived from 2,2-bis(4-hydroxyphenyl) propane, or, aromatic polycarbonate copolymer derived from 2,2-bis(4-hydroxyphenyl) propane and other aromatic dihydroxy compound. The polycarbonate resin may alternatively be a copolymer mainly composed of an aromatic polycarbonate resin, copolymerized with a polymer or oligomer having a siloxane structure. Still alternatively, two or more kinds of the aforementioned polycarbonate resins may be mixed for use. The molecular weight of the polycarbonate resin is adjustable simply by using a monohydric aromatic hydroxy compound, which is exemplified by m- or p-methylphenol, m- or p-propylphenol, p-tert-butylphenol, and phenol substituted by a long chain alkyl group at the p-position.

The polycarbonate resin preferably has a viscosity-average molecular weight (Mv) of 5,000 or larger, which is more preferably 10,000 or larger, and even more preferably 13,000 or larger. With use of the polycarbonate resin having a viscosity-average molecular weight of 5,000 or larger, the obtainable formed article will tend to further improve the mechanical strength. Meanwhile, the polycarbonate resin preferably has a viscosity-average molecular weight (Mv) of 60,000 or smaller, which is more preferably 40,000 or smaller, and even more preferably 30,000 or smaller. At or below 60,000, the resin composition tends to have improved fluidity and improved formability.

Note, the viscosity-average molecular weight (Mv) of the polycarbonate resin in this embodiment is a value determined by measuring viscosity of a methylene chloride solution of the polycarbonate resin at 20° C. with use of an Ubbelohde viscometer to find limiting viscosity ([n]), followed by calculation from the Schnell's viscosity equation below.

$$[\eta]=1.23\times10^{-4}Mv^{0.83}$$

Method of producing the polycarbonate resin, although not specifically limited, may either be the phosgene method (interfacial polymerization) or the fusion method (transesterification). A preferred polycarbonate resin is also obtainable by further subjecting the polycarbonate resin, having been produced by the fusion method, to post-treatment for controlling the content of terminal OH group.

«Polystyrene-Based Resin»

The polystyrene-based resin is exemplified by homopolymer of styrene-based monomer, and copolymer of styrene-based monomer with other copolymerizable monomer.

The polystyrene-based resin is more specifically exemplified by polystyrene resin, acrylonitrile-styrene copolymer (AS resin), high-impact polystyrene-based resin (HIPS), acrylonitrile-butadiene-styrene copolymer (ABS resin), acrylonitrile-acrylic rubber-styrene copolymer (AAS resin), acrylonitrile-styrene-acrylic rubber copolymer (ASA resin), acrylonitrile-ethylene propylene-based rubber-styrene copolymer (AES resin), and styrene-IPN type rubber copolymer.

Content of the rubber component in the polystyrene-based resin, when such rubber component is contained in the polystyrene-based resin, is preferably 3 to 70% by mass, more preferably 5 to 50% by mass, and even more preferably 7 to 30% by mass. With the content of the rubber component controlled to 3% by mass or more, the impact resistance desirably tends to improve, meanwhile with the content controlled to 50% by mass or less, the flame retardance desirably tends to improve. The rubber component preferably has an average particle size of 0.05 to 10 μm, which is more preferably 0.1 to 6 μm, and even more preferably 0.2 to 3 μm. With the average particle size controlled to 0.05 μm or larger, the impact resistance desirably tends to improve, meanwhile with the size controlled to 10 μm or smaller, the outer appearance desirably tends to improve.

The polystyrene-based resin normally has a weight-average molecular weight of 50,000 or larger, which is preferably 100,000 or larger, and more preferably 150,000 or larger, meanwhile, normally 500,000 or smaller, preferably 400,000 or smaller, and more preferably 300,000 or smaller. The number-average molecular weight is normally 10,000 or larger, preferably 30,000 or larger, and more preferably 50,000 or larger, meanwhile, preferably 500,000 or smaller, and more preferably 300,000 or smaller.

The polystyrene-based resin preferably has a melt flow rate (MFR), when measured in compliance with JIS K7210 (at 200° C., under 5 kgf load) of 0.1 to 30 g/10 min, which is more preferably 0.5 to 25 g/10 min. With the MFR controlled to 0.1 g/10 min or above, the fluidity tends to improve, meanwhile, with the MFR controlled to 30 g/10 min or below, the impact resistance tends to improve.

Method of producing such polystyrene-based resin is exemplified by known methods including emulsion polymerization, solution polymerization, suspension polymerization, and bulk polymerization.

«Polyphenylene Ether Resin»

This embodiment can use any of known polyphenylene ether resins, which are exemplified typically by a polymer having, as the principal chain thereof, a structural unit represented by the formula below (preferably, a polymer in which a structural unit represented by the formula below accounts for 90 mol % or more of all structural units while excluding the terminal group). The polyphenylene ether resin may be either homopolymer or copolymer.

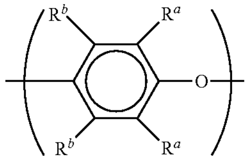

(In the formula, each of two (Ra) s independently represents a hydrogen atom, a halogen atom, a primary or secondary alkyl group, an aryl group, an aminoalkyl group, a halogenated alkyl group, a hydrocarbonoxy group, or a halogenated hydrocarbonoxy group; each of two (Rb) s independently represents a hydrogen atom, a halogen atom, a primary or secondary alkyl group, an aryl group, a halogenated alkyl group, a hydrocarbonoxy group, or halogenated hydrocarbonoxy group, while excluding a case where two (Ra) s concurrently represent hydrogen atoms.)

Each of Ra and Rb independently, and preferably, represents a hydrogen atom, a primary or secondary alkyl group, or an aryl group. Preferred examples of the primary alkyl group include methyl group, ethyl group, n-propyl group, n-butyl group, n-amyl group, isoamyl group, 2-methylbutyl group, 2,3-dimethylbutyl group, 2-, 3- or 4-methylpentyl group, or heptyl group. Preferred examples of the secondary alkyl group include isopropyl group, sec-butyl group, and 1-ethylpropyl group. In particular, Ra preferably represents a primary or secondary alkyl group having 1 to 4 carbon atoms, or a phenyl group. Rb preferably represents a hydrogen atom.

Preferred homopolymer of polyphenylene ether resin is exemplified by polymers of 2,6-dialkyl phenylene ether, such as poly(2,6-dimethyl-1,4-phenylene ether), poly(2,6-diethyl-1, 4-. phenylene ether), poly(2,6-dipropyl-1,4-phenylene ether), poly(2-ethyl-6-methyl-1,4-phenylene ether), and poly(2-methyl-6-propyl-1,4-phenylene ether). The copolymer is exemplified by 2,6-dialkylphenol/2,3,6-trialkylphenol copolymers, such as 2,6-dimethylphenol/2, 3,6-trimethylphenol copolymer, 2,6-dimethylphenol/2, 3,6-triethylphenol copolymer, 2,6-diethylphenol/2, 3,6-trimethylphenol copolymer, and 2,6-dipropylphenol/2, 3,6-trimethylphenol copolymer; graft copolymer having styrene grafted to poly(2,6-dimethyl-1,4-phenylene ether); and graft copolymer having styrene grafted to 2,6-dimethylphenol/2, 3,6-trimethylphenol copolymer.

Particularly preferred polyphenylene ether resin in this embodiment is poly(2,6-dimethyl-1,4-phenylene ether), and 2,6-dimethylphenol/2, 3,6-trimethylphenol random copolymer. Also polyphenylene ether resin described in JP 2005-344065 A, in which the number of terminal groups and copper content ratio are specified, is suitably used.

The polyphenylene ether resin preferably has an intrinsic viscosity, when measured in chloroform at 30° C., of 0.2 to 0.8 dL/g, which is more preferably 0.3 to 0.6 dL/g. With the intrinsic viscosity controlled to 0.2 dL/g or larger, the resin composition may have further improved mechanical strength, meanwhile at or below 0.8 dL/g, the fluidity tends to further improve, and forming process becomes further easier. These ranges of intrinsic viscosity may also be achieved by combining two or more kinds of polyphenylene ether resin differ in intrinsic viscosity.

The polyphenylene ether resin used for this embodiment may be produced by any of known methods without special limitation, typically by oxidative polymerization of a monomer such as 2,6-dimethylphenol in the presence of amine-copper catalyst. In this process, the intrinsic viscosity is adjustable within a desired range, by properly selecting the reaction conditions. The intrinsic viscosity is controllable by selecting conditions including polymerization temperature, polymerization time, amount of catalyst and so forth.

«Polyolefin Resin»

The polyolefin resin is exemplified by polyethylene, polypropylene, polybutene-1, poly-4-methylpentene, and copolymers of these resins.

Polyethylene is exemplified by low-density polyethylene, and high-density polyethylene.

Polypropylene is exemplified by crystalline or amorphous polypropylene.

The copolymer is exemplified by ethylene-propylene random, block or graft copolymer, copolymer of α-olefin with ethylene or propylene, ethylene-vinyl acetate copolymer, ethylene-methyl acrylate copolymer, ethylene-ethyl acrylate copolymer, and ethylene-acrylic acid copolymer.

Among them, crystalline or amorphous polypropylene, and ethylene-propylene random, block or graft copolymer are preferred, wherein propylene-ethylene block copolymer is more preferred. Polypropylene resin is also preferred, since it is inexpensive, and can reduce weight of the formed article by virtue of its small specific gravity.

The polyolefin resin preferably has a melt flow rate (MFR) of 0.1 to 5.0 g/10 min.

«Polyamide Resin»

The polyamide resin is a polymer having, as a structural unit, acid amide obtainable by ring-opening polymerization of lactam, polycondensation of aminocarboxylic acid, or polycondensation of diamine and dibasic acid, and is specifically exemplified by polyamide 6, 11, 12, 46, 66, 610, 612, 6I, 6/66, 6T/61, 6/6T, 66/6T, 66/6T/6I, 1010, and later-detailed xylylenediamine-based polyamide resin, poly (trimethyl hexamethylene terephthalamide), polybis(4-aminocyclohexyl) methanedodecamide, polybis(3-methyl-4-aminocyclohexyl) methanedodecamide, and poly (undecamethylene hexahydroterephthalamide). Note that "I" represents an isophthalic acid component, and "T" represents a terephthalic acid component. The polyamide resin may be understood referring to the description in paragraphs to of JP 2011-132550 A, the content of which is incorporated herein by reference.

The polyamide resin used in this embodiment contains a diamine-derived structural unit and a dicarboxylic acid-derived structural unit, and is preferably a xylylenediamine-based polyamide resin in which 50 mol % or more of the diamine-derived structural unit is derived from xylylenediamine. In the xylylenediamine-based polyamide resin, preferably 70 mol % or more of the diamine-derived structural unit is derived from at least either metaxylylenediamine or paraxylylenediamine, wherein the percentage is more preferably 80 mol % or larger, even more preferably 90 mol % or larger, and yet more preferably 95 mol % or larger. In the xylylenediamine-based polyamide resin, preferably 50 mol % or more of the dicarboxylic acid-derived structural unit is derived from a straight-chain aliphatic α, ω-dicarboxylic acid having 4 to 20 carbon atoms, wherein the percentage is more preferably 70 mol % or larger, even more preferably 80 mol % or larger, yet more preferably 90 mol % or larger, and furthermore preferably 95 mol % or larger. For use as the straight-chain aliphatic α, ω-dibasic acid having 4 to 20 carbon atoms, preferred are adipic acid, sebacic acid, suberic acid, dodecanedioic acid, and eicosanedioic acid. Adipic acid and sebacic acid are more preferred.

Diamine other than metaxylylenediamine and paraxylylenediamine, usable herein as a raw diamine component of the xylylenediamine-based polyamide resin, is exemplified by aliphatic diamines such as tetramethylenediamine, pentamethylenediamine, 2-methyl pentanediamine, hexamethylenediamine, heptamethylenediamine, octamethylenediamine, nonamethylenediamine, decamethylenediamine, dodecamethylenediamine, 2, 2,4-trimethyl-hexamethylenediamine, and 2, 4,4-trimethylhexamethylenediamine; alicyclic diamines such as 1,3-bis(aminomethyl)cyclohexane, 1,4-bis(aminomethyl)cyclohexane, 1,3-diaminocyclohexane, 1,4-diaminocyclohexane, bis(4-aminocyclohexyl) methane, 2,2-bis(4-aminocyclohexyl) propane, bis(aminomethyl) decalin, and bis(aminomethyl)tricyclodecane; and aromatic ring-containing diamines such as bis(4-aminophenyl) ether, paraphenylene diamine, and bis(aminomethyl) naphthalene, all of which may be used singly, or in combination of two or more kinds thereof.

Dicarboxylic acid component other than the straight-chain aliphatic α, o-dicarboxylic acid having 4 to 20 carbon atoms is exemplified by phthalic acid compound such as isophthalic acid, terephthalic acid, and orthophthalic acid; and naphthalenedicarboxylic acid isomers such as 1,2-naphthalenedicarboxylic acid, 1,3-naphthalenedicarboxylic acid, 1,4-naphthalenedicarboxylic acid, 1,5-naphthalenedicarboxylic acid, 1,6-naphthalenedicarboxylic acid, 1,7-naphthalenedicarboxylic acid, 1,8-naphthalenedicarboxylic acid, 2,3-naphthalenedicarboxylic acid, 2,6-naphthalenedicarboxylic acid, and 2,7-naphthalenedicarboxylic acid, wherein all of them may be used singly, or two or more of them may be used in combination.

Content of the thermoplastic resin in the resin composition of this embodiment (preferably, polybutylene terephthalate resin), is preferably 30% by mass or more in the resin composition, more preferably 35% by mass or more, even more preferably 37% by mass or more, and yet more preferably 40% by mass or more. At or above the lower limit value, the chemical resistance tends to improve. Meanwhile, the content of the thermoplastic resin (preferably, polybutylene terephthalate resin) is preferably 80% by mass or less, more preferably 75% by mass or less, even more preferably 72% by mass or less, yet more preferably 66% by mass or less, furthermore preferably 60% by mass or less, may be 55% by mass or less, 50% by mass or less, and 47% by mass or less. At or below the upper limit value, warpage of the formed article tends to be reduced more effectively.

The resin composition of this embodiment may contain only one kind of, or two or more kinds of the thermoplastic resin. When two or more kinds are contained, the total content preferably falls within any of the aforementioned ranges.

<Electromagnetic Wave Absorbing Material>

The resin composition of this embodiment contains the electromagnetic wave absorbing material. With the electromagnetic wave absorbing material contained therein, the resin composition will have electromagnetic wave absorptivity.

The electromagnetic wave absorbing material is exemplified by metal, metal oxide, carbon-containing electromagnetic wave absorbing material, and conductive polymer. The carbon-containing electromagnetic wave absorbing material is preferred.

The metal is exemplified by copper, nickel, silver, and stainless steel, preferably in the form of metal filler, stainless steel fiber, or magnetic filler. The metal oxide is exemplified by alumina and zinc oxide, preferably in the form of alumina fiber and zinc oxide nanotube. The carbon-containing electromagnetic wave absorbing material is exemplified by carbon black, Ketjen black, graphene, graphite, fullerene, carbon nanocoil, carbon nanotube, and carbon nanofiber. Carbon nanotube is more preferred.

Also preferred are fiber and so forth, coated with metal, metal oxide, or carbon-containing electromagnetic wave absorbing material, which are exemplified by potassium titanate whisker coated with carbon, and metal-coated fiber.

The electromagnetic wave absorbing material in this embodiment preferably has a relatively thin and long geometry, such as fiber, tube, and whisker.

The electromagnetic wave absorbing material preferably has a diameter (number-average fiber diameter) of 0.5 nm or larger, which is more preferably 1 nm or larger, and even more preferably 3 nm or larger, meanwhile, preferably 50 μm or smaller, more preferably 20 μm or smaller, even more preferably 500 nm or smaller, and yet more preferably 100 nm or smaller.

The electromagnetic wave absorbing material preferably has an aspect ratio of 5 or larger, from the viewpoint of achieving good electromagnetic wave absorptivity, which is more preferably 50 or larger. The upper limit value is typically 500 or below, although not specifically limited.

As described previously, known carbonaceous electromagnetic wave absorbing materials include carbon black, graphite, carbon fiber, and carbon nanotube. With the carbon nanotube selected from among these carbonaceous electromagnetic wave absorbing materials, this embodiment successfully achieves high electromagnetic wave absorbance, low electromagnetic wave transmittance and reflectance, as well as small variation of reflectance irrespective of frequency. This embodiment also successfully enhances the mechanical strength of the formed article.

The carbon nanotube used in this embodiment may be any of monolayered carbon nanotube, multi-layered carbon nanotube, or mixture, wherein the multi-layered carbon nanotube is preferred. Also a carbonaceous material partially having a structure of carbon nanotube is acceptable. The carbon nanotube may have not only a cylindrical shape, but also a coil shape with a coil pitch of 1 μm or smaller.

The carbon nanotube is commercially available, and is exemplified by those available from Bayer MaterialScience AG, Nanocyl S. A., Showa Denko K. K., and Hyperion Catalysis International, Inc. Note that the carbon nanotube is alternatively referred to as graphite fibril or carbon fibril.

The carbon nanotube preferably has a diameter of 0.5 to 100 nm, which is more preferably 1 to 30 nm. The carbon nanotube preferably has an aspect ratio of 5 or larger from the viewpoint of imparting good electromagnetic wave absorbance, which is more preferably 50 or larger. The upper limit value is typically 500 or smaller, but not particularly limited thereto.

The resin composition of this embodiment preferably contains 0.1 to 10.0 parts by mass of an electromagnetic wave absorbing material (preferably carbon nanotube), per 100 parts by mass of the thermoplastic resin (preferably polybutylene terephthalate resin). With the electromagnetic wave absorbing material (preferably carbon nanotube) contained therein, the resin composition can effectively absorb electromagnetic wave only with a small amount of blending, can effectively suppress transmission and reflection of electromagnetic wave, and can reduce variation of reflectance of electromagnetic wave of 70 to 80 GHz frequency. Also the obtainable formed article may have enhanced mechanical strength.

The resin composition of this embodiment preferably contains 0.1 parts by mass or more of the electromagnetic wave absorbing material (preferably carbon nanotube), per 100 parts by mass of a thermoplastic resin, wherein the content is more preferably 1.0 part by mass or more, even more preferably 1.5 parts by mass or more, yet more preferably 1.8 parts by mass or more, and furthermore preferably 2.0 parts by mass or more. At or above the lower limit value, the electromagnetic wave absorbance is more effectively demonstrated. Meanwhile, the resin composition of this embodiment preferably contains 10.0 parts by mass or less of the, per 100 parts by mass of a thermoplastic resin, wherein the content is more preferably 8.0 parts by mass or less, even more preferably 7.0 parts by mass or less, and yet more preferably 6.0 parts by mass or less. At or below the upper limit value, the relative amount of blending of the glass fiber may be increased, thus enhancing the mechanical strength of the obtainable formed article.

In a special case where the resin composition of this embodiment contains the polybutylene terephthalate resin, and in a more special case where the resin component is substantially composed of the polybutylene terephthalate resin, the resin composition of this embodiment preferably contains 0.1 parts by mass or more of the electromagnetic wave absorbing material (preferably carbon nanotube), per 100 parts by mass of polybutylene terephthalate resin, wherein the content is more preferably 1.0 part by mass or more, even more preferably 1.5 parts by mass or more, yet more preferably 1.8 parts by mass or more, furthermore preferably 2.0 parts by mass or more, again furthermore preferably 3.0 parts by mass or larger, and most preferably exceeds 3.0 parts by mass. At or above the lower limit value, the electromagnetic wave absorbance is effectively demonstrated. Meanwhile, the resin composition of this embodiment preferably contains 10.0 parts by mass or less of the electromagnetic wave absorbing material (preferably carbon nanotube), per 100 parts by mass of polybutylene terephthalate resin, wherein the content is preferably 8.0 parts by mass or less, more preferably 7.0 parts by mass or less, even more preferably 6.0 parts by mass or less, furthermore preferably 5.0 parts by mass or less, and again furthermore preferably 4.0 parts by mass or less. At or below the upper limit value, for example, the relative amount of blending of the glass fiber may be increased, thus enhancing the mechanical strength of the obtainable formed article.

In a special case where the resin composition of this embodiment contains the crystalline resin, the resin composition of this embodiment preferably contains 0.1 parts by mass or more of the electromagnetic wave absorbing material (preferably carbon nanotube), per 100 parts by mass of the crystalline thermoplastic resin, wherein the content is more preferably 0.3 parts by mass or more, even more preferably 0.5 parts by mass or more, may be 1.8 parts by mass or more, even may be 2.0 parts by mass or more, and particularly may be 2.4 parts by mass or more. At or above the lower limit value, the electromagnetic wave absorbance is effectively demonstrated. Meanwhile, the resin composition of this embodiment preferably contains 10.0 parts by mass or less of the electromagnetic wave absorbing material (preferably carbon nanotube), per 100 parts by mass of the crystalline thermoplastic resin, wherein the content is more preferably 8.0 parts by mass or less, even more preferably 6.0 parts by mass or less, yet more preferably 4.0 parts by mass or less, furthermore preferably 3.0 parts by mass or less, and may even be 2.5 parts by mass or less. At or below the upper limit value, the combustion time measured in combustion test tends to be further shortened.

An embodiment of the resin composition of this embodiment contains no carbonaceous electromagnetic wave absorbing material other than the carbon nanotube, or contains it only up to a content less than 3% by mass relative to the thermoplastic resin. With such structure, the frequency dependence of electromagnetic wave reflectance tends to further improve.

In this embodiment, the content of the carbonaceous electromagnetic wave absorbing material other than the carbon nanotube is preferably less than 2% by mass, more preferably less than 1% by mass, even more preferably less than 0.5% by mass, yet more preferably less than 0.1% by mass, furthermore preferably less than 0.05% by mass, and again furthermore preferably less than 0.01% by mass.

Another embodiment of the resin composition of this embodiment contains no carbon fiber, or contains the carbon fiber only up to a content less than 3% by mass. With such structure, the frequency dependence of electromagnetic wave reflectance tends to further improve. The electromagnetic wave reflectance may further be reduced.

In this embodiment, the content of the carbon fiber is preferably less than 2% by mass, more preferably less than 1% by mass, even more preferably less than 0.5% by mass, yet more preferably less than 0.1% by mass, furthermore preferably less than 0.05% by mass, and again furthermore preferably less than 0.01% by mass.

Another embodiment of the resin composition of this embodiment contains no graphite, or contains the graphite only up to a content less than 3% by mass. With such structure, the frequency dependence of electromagnetic wave reflectance tends to further improve. Also the electromagnetic wave absorbance may further be enhanced. Moreover, the obtainable formed article may have further improved mechanical strength.

In this embodiment, the content of the graphite is preferably less than 2% by mass, more preferably less than 1% by mass, even more preferably less than 0.5% by mass, yet more preferably less than 0.1% by mass, furthermore preferably less than 0.05% by mass, and again furthermore preferably less than 0.01% by mass.

Another embodiment of the resin composition of this embodiment contains no carbon black, or contains the carbon black only up to a content less than 3% by mass. With such structure, the frequency dependence of electromagnetic wave reflectance tends to further improve. Also, the obtainable formed article may have further improved mechanical strength.

In this embodiment, the content of the carbon black is preferably less than 2% by mass, more preferably less than 1% by mass, even more preferably less than 0.5% by mass, yet more preferably less than 0.1% by mass, furthermore preferably less than 0.05% by mass, and again furthermore preferably less than 0.01% by mass.

Another embodiment of the resin composition of this embodiment preferably contains no Ketjen black, or contains the Ketjen black only up to a content less than 3% by mass. With such structure, the frequency dependence of electromagnetic wave reflectance tends to further improve. Also, the obtainable formed article may have further improved mechanical strength. In this embodiment, the content of the Ketjen black is preferably less than 2% by mass, more preferably less than 1% by mass, even more preferably less than 0.5% by mass, yet more preferably less than 0.1% by mass, furthermore preferably less than 0.05% by mass, and again furthermore preferably less than 0.01% by mass.

Also an embodiment that satisfies two or more of the aforementioned embodiments is preferred. Also an embodiment that satisfies all of the aforementioned embodiments is preferred.

Content of the electromagnetic wave absorbing material (preferably carbon nanotube) in the resin composition of this embodiment is preferably 0.1% by mass or more of the resin composition, more preferably 0.5% by mass or more, and even more preferably 1.0% by mass or more. At or above the lower limit value, more stabilized electromagnetic wave absorbance tends to be obtainable. Meanwhile, at or below the upper limit value, the resin composition will tend to keep the impact resistance at a high level.

The resin composition of this embodiment may contain only one kind of, or two or more kinds of the electromagnetic wave absorbing material (preferably carbon nanotube). When two or more kinds are contained, the total content preferably falls within any of the aforementioned ranges.

<Reinforcing Material>

The resin composition of this embodiment may contain a reinforcing material. With the reinforcing material contained therein, the obtainable formed article may have improved mechanical strength.

The reinforcing material usable in this embodiment may be any of fiber, filler and bead, without special limitation on the types and so forth, wherein fiber (reinforcing fiber) is preferred.

The reinforcing material, if in the form of fiber, may be either staple fiber or filament yarn.

In a case where the reinforcing material is any of staple fiber, filler, bead or the like, the resin composition of this embodiment is exemplified by those in the form of pellet, pulverized pellet, and film formed from such pellet.

The reinforcing material, if in the form of filament yarn, is exemplified by filament yarn for so-called unidirectional (UD) material, and sheet-like filament yarn which is woven or knitted. When using such filament yarn, the component of the resin composition of this embodiment, other than the reinforcing material, may be impregnated into the reinforcing material in such form of sheet-like filament yarn, to produce a sheet-like resin composition (prepreg, for example).

Raw material of the reinforcing material is exemplified by inorganic materials such as glass, carbon (carbon fiber, etc.), alumina, boron, ceramic, and metal (steel, etc.); and organic materials such as plant (including kenaf, bamboo, etc.), aramid, polyoxymethylene, aromatic polyamide, poly(paraphenylene benzobisoxazole), and ultrahigh molecular weight polyethylene. Glass is preferred.

That is, the resin composition of this embodiment preferably contains 10 to 100 parts by mass of the reinforcing material (preferably glass fiber), per 100 parts by mass of the thermoplastic resin (preferably polybutylene terephthalate resin). With the glass fiber contained therein, the electromagnetic wave absorber formed of the resin composition of this embodiment may have improved mechanical strength. The glass fiber is selectable from those having glass composition of A-glass, C-glass, E-glass, R-glass, D-glass, M-glass, S-glass and so forth. E-glass (non-alkali glass) is particularly preferred.

The glass fiber is defined as an article that looks fibrous, and has an exact circular or polygonal cross section perpendicular to the longitudinal direction. The glass fiber normally has a number-average fiber diameter of monofilament of 1 to 25 μm, which is preferably 5 to 17 μm. With the number-average fiber diameter adjusted to 1 μm or longer, the resin composition tends to further improve the formability. With the number-average fiber diameter adjusted to 25 μm or shorter, the obtainable electromagnetic wave absorber may have improved appearance, and will tend to enhance the reinforcing effect. The glass fiber may be a monofilament, or a twisted yarn formed of a plurality of monofilaments.

Product form of the glass fiber may be any of "glass roving" which is a roll on which a monofilament or twisted yarn made of a plurality of monofilaments are continuously wound, "chopped strand" cut into 1 to 10 mm length (that is, glass fiber having a number-average fiber length of 1 to 10 mm), and "milled fiber" ground into 10 to 500 μm length (that is, glass fiber having a number-average fiber length of 10 to 500 μm). The chopped strand uniformly cut into 1 to 10 mm length is preferred. Also glass fibers with different morphologies may be used in a combined manner.

Also glass fibers having modified cross sectional shapes are preferred. The modified cross sectional shape is typically represented by a flattening ratio, which is defined by a long diameter-to-short diameter proportion of a cross section perpendicular to the longitudinal direction of the fiber, of 1.5 to 10, which is preferably 2.5 to 10, more preferably 2.5 to 8, and particularly preferably 2.5 to 5.

For the purpose of improving affinity with the resin component, the glass fiber may be surface-treated typically with a silane-based compound, epoxy-based compound, or urethane-based compound, or may be subjected to oxidation treatment, without largely undermining properties of the resin composition of this embodiment.

The resin composition of this embodiment preferably contains 10 parts by mass or more of the reinforcing material (preferably glass fiber), per 100 parts by mass of the thermoplastic resin (preferably polybutylene terephthalate resin), wherein the content is more preferably 20 parts by mass or more, even more preferably 35 parts by mass or more, yet more preferably 47 parts by mass or more, furthermore preferably 55 parts by mass or more, and again furthermore preferably 63 parts by mass or more. At or above the lower limit value, the mechanical strength tends to further improve. Meanwhile, the content of the reinforcing material (preferably glass fiber) is preferably 100 parts by mass or less, per 100 parts by mass of the thermoplastic resin (preferably polybutylene terephthalate resin), more preferably 90 parts by mass or less, even more preferably 85 parts by mass or less, yet more preferably 80 parts by mass or less, and furthermore preferably 75 parts by mass or less. At or below the upper limit value, the formed article may have improved appearance, and the molten resin will tend to have further improved fluidity.

Content of the reinforcing material (preferably glass fiber) in the resin composition of this embodiment is preferably 10% by mass or more in the resin composition, more preferably 15% by mass or more, even more preferably 20% by mass or more, and yet more preferably 25% by mass or more. Meanwhile the content of the reinforcing material (preferably glass fiber) in the resin composition is preferably 50% by mass or less, more preferably 45% by mass or less, yet more preferably 40% by mass or less, and furthermore preferably 35% by mass or less. At or above the lower limit value, the mechanical strength tends to further improve. Meanwhile, at or below the upper limit value, the formed article may have improved appearance, and the molten resin will tend to have further improved fluidity.

The resin composition of this embodiment may contain only one kind of, or two or more kinds of the reinforcing materials (preferably glass fiber). When two or more kinds are contained, the total content preferably falls within any of the aforementioned ranges.

The resin composition of this embodiment preferably has a mass proportion of the electromagnetic wave absorbing material (preferably carbon nanotube) and the glass fiber (electromagnetic wave absorbing material/glass fiber) of 0.01 or larger, which is more preferably 0.02 or larger, even more preferably 0.025 or larger, yet more preferably 0.04 or larger, and furthermore preferably 0.05 or larger. At or above the lower limit value, a further advanced level of electromagnetic wave absorbance tends to be obtainable. Meanwhile, the mass proportion of the electromagnetic wave absorbing material and the glass fiber is preferably 0.30, more preferably 0.20 or smaller, even more preferably 0.10 or smaller, and yet more preferably 0.07 or smaller. At or below the upper limit value, the resin composition will tend to have further enhanced impact strength.

<Reactive Compound>

The resin composition of this embodiment preferably contains 0.01 to 5.0 parts by mass of a reactive compound, per 100 parts by mass of the thermoplastic resin (preferably polybutylene terephthalate resin). With the reactive compound contained therein, the obtainable resin composition may have improved mechanical strength, and excellent hydrolysis resistance.

The reactive compound usable in this embodiment preferably contains at least one compound selected from a group consisting of epoxy group-containing compound, carbodiimide compound, oxazoline group-containing compound, and oxazine group-containing compound. The epoxy group-containing compound is more preferably contained.

«Compound Having Epoxy Group (Epoxy Resin)»

The epoxy group-containing compound has one or more epoxy groups in one molecule, and is exemplified by glycidyl compound, aromatic ring-containing compound having epoxy group, and epoxy group-containing alicyclic compound. At least the aromatic ring-containing compound having epoxy group is preferably contained.

The epoxy group-containing compound is specifically exemplified by aromatic ring-containing epoxy compound such as bisphenol A-type epoxy compound (including bisphenol A diglycidyl ether), bisphenol F-type epoxy compound (including bisphenol F diglycidyl ether), biphenyl-type epoxy compound (including bis(glycidyloxy) biphenyl), resorcin-type epoxy compound (including resorcinol diglycidyl ether), novolac-type epoxy compound, glycidyl benzoate, diglycidyl terephthalate, and diglycidyl orthophthalate; (di)glycidyl ethers such as methyl glycidyl ether, butyl glycidyl ether, 2-ethylhexyl glycidyl ether, decyl glycidyl ether, stearyl glycidyl ether, phenyl glycidyl ether, butylphenyl glycidyl ether, allyl glycidyl ether, neopentyl glycol diglycidyl ether, ethylene glycol diglycidyl ether, glycerin diglycidyl ether, and propylene glycol diglycidyl ether; paraffinic (e.g., saturated fatty acid-based) or olefinic (e.g., unsaturated fatty acid-based) (di)glycidyl esters such as glycidyl sorbate, diglycidyl adipate, epoxylated linseed oil, and epoxylated soybean oil; alicyclic epoxy compounds such as vinylcyclohexene oxide, and dicyclopentadiene oxide; and epoxy modified styrene-acrylic copolymer.

Among them, more preferred are styrene-acrylic copolymer having glycidyl group in the side chain, bisphenol A-type epoxy compound, novolac-type epoxy compound, bisphenol F-type epoxy compound, and biphenyl-type epoxy compound; and more preferred is bisphenol A-type epoxy compound.

«Carbodiimide Compound»

The resin composition of this embodiment also preferably contains a carbodiimide compound as the reactive compound. The carbodiimide compound has a carbodiimide group (—N=C=N—) in its molecule. The carbodiimide compound applicable herein may be any of aliphatic carbodiimide compound having an aliphatic principal chain, alicyclic carbodiimide compound having an alicyclic principal chain, or aromatic carbodiimide compound having an aromatic principal chain. Among them, aliphatic carbodiimide compound that excels in reactivity with the polymer terminal is preferably used. The carbodiimide compound may be of either monomer-type or polymer-type. The polymer-type is preferred in this embodiment.

The aliphatic carbodiimide compound may be exemplified by diisopropylcarbodiimide, and dioctyldecylcarbodiimide. The alicyclic carbodiimide compound is preferably exemplified by dicyclohexylcarbodiimide, and poly(4,4'-dicyclohexylmethane carbodiimide). Poly(4,4'-dicyclohexylmethane carbodiimide) is particularly preferred.

Commercial product may be exemplified by "Carbodilite" (product name; from Nisshinbo Chemical Inc.).

The aromatic carbodiimide compound is exemplified by mono- and di-carbodiimide compounds such as diphenylcarbodiimide, di-2,6-dimethyl phenylcarbodiimide, N-triyl-N'-phenylcarbodiimide, di-p-nitrophenylcarbodiimide, di-p-aminophenylcarbodiimide, di-p-hydroxyphenylcarbodiimide, di-p-chlorophenylcarbodiimide, di-p-methoxyphenylcarbodiimide, di-3,4-dichlorophenylcarbodiimide, di-2,5-dichlorophenylcarbodiimide, di-o-chlorophenylcarbodiimide, p-phenylene-bis-di-o-triylcarbodiimide, p-phenylene-bis-dicyclohexylcarbodiimide, p-phenylene-bis-di-p-chlorophenylcarbodiimide, and ethylene-bis-diphenylcarbodiimide; and polycarbodiimide compounds such as poly(4,4'-diphenylmethane carbodiimide), poly(3,5'-dimethyl-4,4'-biphenylmethane carbodiimide), poly(p-phenylene carbodiimide), poly(m-phenylene carbodiimide), poly(3,5'-dimethyl-4,4'-diphenylmethane carbodiimide), poly(naphthylene carbodiimide), poly(1,3-diisopropylphenylene carbodiimide), poly(1-methyl-3,5-diisopropylphenylene carbodiimide), poly(1,3,5-triethylphenylene carbodiimide) and poly(triisopropylphenylene carbodiimide). Two or more kinds of these compounds may be used in combination.

«Compound Having Oxazoline Group»

The compound having oxazoline group may be exemplified by oxazoline, alkyl oxazoline (alkyl oxazoline having 1 to 4 carbon atoms, such as 2-methyloxazoline, and 2-ethyloxazoline), and bisoxazoline compound.

The bisoxazoline compound is exemplified by 2,2'-bis(2-oxazoline); 2,2'-bis(alkyl-2-oxazoline) [2,2'-bis(C1-6 alkyl-2-oxazoline) such as 2,2'-bis(4-methyl-2-oxazoline), 2,2'-bis (4-ethyl-2-oxazoline), 2,2'-bis(4,4-dimethyl-2-oxazoline), etc.]; 2,2'-bis(aryl-2-oxazoline) [2,2'-bis(4-phenyl-2-oxazoline), etc.]; 2,2'-bis(cycloalkyl-2-oxazoline) [2,2'-bis(4-cyclohexyl-2-oxazoline), etc.]; 2,2'-bis(aralkyl-2-oxazoline) [2,2'-bis(4-benzyl-2-oxazoline), etc.]; 2,2'-alkylenebis(2-oxazoline) [2,2'-C1-10 alkylenebis(2-oxazoline) such as 2,2'-ethylenebis(2-oxazoline), 2,2'-tetramethylenebis(2-oxazoline), etc.]; 2,2'-alkylenebis(alkyl-2-oxazoline) [2,2'-C1-10 alkylenebis(C1-6 alkyl-2-oxazoline) such as 2,2'-ethylenebis(4-methyl-2-oxazoline), 2,2'-tetramethylenebis(4,4-dimethyl-2-oxazoline), etc.]; 2,2'-arylenebis(2-oxazoline) [2,2'-(1,3-phenylene)-bis(2-oxazoline), 2,2'-(1,4-phenylene)-bis(2-oxazoline), 2,2'-(1,2-phenylene)-bis(2-oxazoline), 2,2'-diphenylene bis(2-oxazoline), etc.]; 2,2'-arylenebis(alkyl-2-oxazoline) [2,2'-phenylene-bis(C1-6 alkyl-2-oxazoline) such as 2,2'-(1,3-phenylene)-bis(4-methyl-2-oxazoline), 2,2'-(1,4-phenylene)-bis(4,4-dimethyl-2-oxazoline), etc.]; 2,2'-aryloxyalkanebis(2-oxazoline) [2,2'-9,9'-diphenoxyethanebis(2-oxazoline), etc.]; 2,2'-cycloalkylenebis(2-oxazoline) [2,2'-cyclohexylenebis(2-oxazoline), etc.]; N,N'-alkylenebis(2-carbamoyl-2-oxazoline) [N,N'-C1-10 alkylenebis(2-carbamoyl-2-oxazoline) such as N,N'-ethylenebis(2-carbamoyl-2-oxazoline), N,N'-tetramethylenebis(2-carbamoyl-2-oxazoline), etc.]; N,N'-alkylenebis(2-carbamoyl-alkyl-2-oxazoline) [N,N'-C1-10 alkylenebis(2-carbamoyl-C1-6 alkyl-2-oxazoline) such as N,N'-ethylenebis(2-carbamoyl-4-methyl-2-oxazoline), N,N'-tetramethylenebis(2-carbamoyl- 4,4-dimethyl-2-oxazoline), etc.]; and N,N'-arylenebis(2-carbamoyl-2-oxazoline) [N,N'-phenylene bis(2-carbamoyl-oxazoline), etc.].

The oxazoline group-containing compound also includes vinyl polymers having oxazoline group (Epocros RPS Series, RAS Series, and RMS Series, etc., from Nippon Shokubai Co., Ltd.). Among these oxazoline compounds, preferred is bisoxazoline compound.

«Compound Having Oxazine Group»Oxazine or bisoxazine compound may be used as the oxazine group-containing compound.

The bisoxazine compound is typically exemplified by 2,2'-bis(5,6-dihydro-4H-1,3-oxazine); 2,2'-bis(alkyl-5,6-dihydro-4H-1,3-oxazine) [2,2'-bis(C1-6 alkyl-5,6-dihydro-4H-1,3-oxazine) such as 2,2'-bis(4-methyl-5,6-dihydro-4H-1,3-oxazine), 2,2'-bis(4,4-dimethyl-5,6-dihydro-4H-1,3-oxazine), and 2,2'-bis(4,5-dimethyl-5,6-dihydro-4H-1,3-oxazine), etc.]; 2,2'-alkylenebis(5,6-dihydro-4H-1,3-oxazine) [2,2'-C1-10 alkylenebis(5,6-dihydro-4H-1,3-oxazine) such as 2,2'-methylenebis(5,6-dihydro-4H-1,3-oxazine), 2,2'-ethylenebis(5,6-dihydro-4H-1,3-oxazine), and 2,2'-hexanemethylenebis(5,6-dihydro-4H-1,3-oxazine), etc.]; 2,2'-arylenebis(5,6-dihydro-4H-1,3-oxazine) [2,2'-(1,3-phenylene)-bis(5,6-dihydro-4H-1,3-oxazine), 2,2'-(1,4-phenylene)-bis(5,6-dihydro-4H-1,3-oxazine), 2,2'-(1,2-phenylene)-bis(5, 6-dihydro-4H-1, 3-oxazine), 2,2'-naphthylene bis(5, 6-dihydro-4H-1, 3-oxazine), 2,2'-diphenylene bis(5, 6-dihydro-4H-1, 3-oxazine), etc.]; N,N'-alkylenebis(2-carbamoyl-5, 6-dihydro-4H-1, 3-oxazine) [N,N'-C1-10 alkylenebis(2-carbamoyl-5,6-dihydro-4H-1, 3-oxazine) such as N,N'-ethylenebis(2-carbamoyl-5, 6-dihydro-4H-1, 3-oxazine), and N,N'-tetramethylenebis(2-carbamoyl-5, 6-dihydro-4H-1, 3-oxazine), etc.]; N,N'-alkylenebis(2-carbamoyl-alkyl-5, 6-dihydro-4H-1, 3-oxazine) [N, N'-C1-10 alkylenebis(2-carbamoyl-C16 alkyl-5, 6-dihydro-4H-1, 3-oxazine) such as N,N'-ethylenebis(2-carbamoyl-4-methyl-5, 6-dihydro-4H-1, 3-oxazine), and N,N'-hexamethylenebis (2-carbamoyl-4, 4-dimethyl-5, 6-dihydro-4H-1, 3-oxazine), etc.]; and N,N'-arylenebis(2-carbamoyl-5, 6-dihydro-4H-1, 3-oxazine) [N,N'-phenylenebis(2-carbamoyl-oxazine), etc.]. Among these oxazine compounds, preferred is bisoxazine compound.

Content of the reactive compound in the resin composition of this embodiment is preferably 0.01 parts by mass or more, per 100 parts by mass of the thermoplastic resin, wherein the content is more preferably 0.1 parts by mass or more, even more preferably 0.3 parts by mass or more, and yet more preferably 0.5 parts by mass or more. At or above the lower limit value, the hydrolysis resistance tends to further improve. Meanwhile, the content of the reactive compound is preferably 5.0 parts by mass or less, per 100 parts by mass of the thermoplastic resin, wherein the content is more preferably 3.0 parts by mass or less, even more preferably 2.0 parts by mass or less, and yet more preferably 1.2 parts by mass or less. At or below the upper limit value, the melt viscosity tends to further stabilize, and the formability tends to improve.

In a special case where the resin composition of this embodiment contains the polybutylene terephthalate resin, and in a more special case where the resin component is substantially composed of the polybutylene terephthalate resin, the content of the reactive compound in the resin composition of this embodiment is preferably 0.01 parts by mass or more, per 100 parts by mass of polybutylene terephthalate resin, more preferably 0.1 parts by mass or more, even more preferably 0.3 parts by mass or more, yet more preferably 0.5 parts by mass or more, and furthermore preferably 0.8 parts by mass or more. At or above the lower limit value, the hydrolysis resistance tends to further improve. Meanwhile, the content of the reactive compound is preferably 5.0 parts by mass or less, per 100 parts by mass of polybutylene terephthalate resin, more preferably 3.0 parts by mass or less, even more preferably 2.0 parts by mass or less, and yet more preferably 1.2 parts by mass or less. At or below the upper limit value, the melt viscosity tends to further stabilize, and the formability tends to improve.

The resin composition of this embodiment may contain only one kind of, or two or more kinds of the reactive compound. When two or more kinds are contained, the total content preferably falls within any of the aforementioned ranges.

<Flame Retardant>

The resin composition of this embodiment may also have flame retardance. The flame retardance is normally achieved by using a flame retardant. The flame retardant includes halogen-containing flame retardant, phosphorus-containing flame retardant (metal phosphinate, melamine polyphosphate, etc.), nitrogen-containing flame retardant (melamine cyanurate, etc.), and metal hydroxide (magnesium hydroxide, etc.), among which preferred are phosphorus-containing flame retardant, and halogen-containing flame retardant. The phosphorus-containing flame retardant is more preferably metal phosphinate. The halogen-containing flame retardant is more preferably bromine-containing flame retardant. The resin composition of this embodiment may also contain a flame retardant auxiliary.

A first embodiment of a case where the resin composition of this embodiment has flame retardance is exemplified by a resin composition that contains the thermoplastic resin, the carbon nanotube and the bromine-containing flame retardant, in which the electromagnetic wave absorbing material (preferably carbon nanotube) and bromine atom (Br) contained in the bromine-containing flame retardant satisfy a mass proportion electromagnetic wave absorbing material (preferably carbon nanotube)/Br of 0.01 to 0.40. The first embodiment preferably contains a flame retardant auxiliary, and more preferably contains an antimony compound.

Particularly with the electromagnetic wave absorbing material (preferably carbon nanotube) blended therein, the first embodiment can enhance the electromagnetic wave absorbance. Moreover, with the carbon nanotube (CNT) blended therein in addition to the bromine-containing flame retardant, the thermoplastic resin may be suppressed from dripping during the combustion test, thus enhancing the flame retardance (UL94). The dripping may be suppressed presumably because the CNT has a fibrous form, and is well adhesive to the thermoplastic resin. On the other hand, if the bromine-containing flame retardant is scarce, CNT is relatively rich, and the CNT/Br falls outside the predetermined range, the resin composition will undesirably sustain combustion for a long period, due to abundance of the CNT relative to the bromine-containing flame retardant. This is presumably because the CNT is carbonaceous, and can burn by itself if blended too much. Now, this embodiment precisely controls the mass proportion of bromine atom (Br) contained in the bromine-containing flame retardant, to successfully achieve high flame retardance, while achieving high electromagnetic wave absorbance.

In the first mode of this embodiment, the mass proportion of the electromagnetic wave absorbing material (preferably carbon nanotube) and bromine atom (Br) contained in the bromine-containing flame retardant, denoted as electromagnetic wave absorbing material (preferably carbon nanotube)/Br, is 0.01 to 0.40. At or below the lower limit value, the electromagnetic wave absorbance improves. At or above the lower limit value, the combustion time may be shortened. Now, the flame retardance of the bromine-containing flame retardant is generally believed to be proportional to the amount of bromine atom. This is on the basis that bromine atom is less likely to combine with oxygen, thus suppressing the combustion. Moreover, bromine atom reacts with antimony at high temperatures, to more effectively demonstrate the flame retardance.

The electromagnetic wave absorbing material (preferably carbon nanotube)/Br is preferably 0.05 or larger, more preferably 0.08 or larger, even more preferably 0.10 or larger, and may be 0.16 or larger, 0.20 or larger, or 0.25 or larger. Meanwhile, the electromagnetic wave absorbing material (preferably carbon nanotube)/Br is preferably 0.38 or smaller, more preferably 0.35 or smaller, and may be 0.30 or smaller, 0.28 or smaller, or 0.16 or smaller. In particular, with the electromagnetic wave absorbing material (preferably carbon nanotube)/Br controlled to 0.05 or larger, the obtainable resin composition may have electromagnetic wave property, particularly featured by high absorbance and low transmittance. Meanwhile, with the electromagnetic wave absorbing material (preferably carbon nanotube)/Br controlled to 0.14 or smaller, the combustion time may be shortened.

A second mode of this embodiment, in which the resin composition of this embodiment has flame retardance, is exemplified by a resin composition that contains the crystalline thermoplastic resin, the electromagnetic wave absorbing material (preferably carbon nanotube), and the flame retardant, and that demonstrates an absorbance at 76.5 GHz frequency, when formed to a thickness of 2 mm and determined by Equation (A), of 40.0 to 100%.

With the electromagnetic wave absorbing material (preferably carbon nanotube) blended therein in the second mode of this embodiment, the formed article may have enhanced electromagnetic wave absorbance. Also with the carbon nanotube blended therein together with the flame retardant, the formed article may have improved flame retardance (UL94). This is attributable not only to an effect demonstrated by the flame retardant, but also to that the CNT has a fiber form, highly adhesive to the crystalline thermoplastic resin, and can therefore suppress the dripping. In addition, use of the crystalline thermoplastic resin as the thermoplastic resin presumably enhances the chemical resistance of the formed article. Presumably as a result of effective interaction of these components, without adversely affecting each other, the formed article was obtained with high electromagnetic wave absorbance, as well as high flame retardance and chemical resistance.

The second mode of embodiment preferably, and additionally, contains a flame retardant auxiliary. Also a reinforcing material is preferably contained.

A third mode of this embodiment, in which the resin composition of this embodiment has flame retardance, is exemplified by a resin composition that contains the thermoplastic resin, the reinforcing fiber, the electromagnetic wave absorbing material (preferably carbon nanotube), and the flame retardant, and that demonstrates an absorbance at 76.5 GHZ frequency, when formed to a thickness of 2 mm and determined by Equation (A), of 40.0 to 100%. The resin composition preferably, and additionally contains a flame retardant, and more preferably contains a bromine-containing flame retardant.

With the electromagnetic wave absorbing material (preferably carbon nanotube) blended therein in the third mode of this embodiment, the formed article may have enhanced electromagnetic wave absorbance. Also with the flame retardant blended therein together with the CNT, the formed article may have improved flame retardance (UL94). This is attributable not only to an effect demonstrated by the flame retardant, but also to that the CNT has a fiber form, highly adhesive to the crystalline thermoplastic resin, and can therefore suppress the dripping. In addition, blending of the reinforcing fiber presumably enhanced the deflection temperature under load. This is presumably because the reinforcing fiber can suppress softening of the resin at high temperatures. Moreover, blending of the reinforcing fiber presumably reduces relative content of the thermoplastic resin, thus reducing the easily carbonizable component, and thus improving the flame retardance. Presumably as a result of effective interaction of these components, without adversely affecting each other, the formed article was obtained with high electromagnetic wave absorbance, as well as high flame retardance and heat resistance.

«Bromine-Containing Flame Retardant»

Next, the bromine-containing flame retardant will be explained. The bromine-containing flame retardant is preferably brominated phthalimide, brominated poly(meth)acrylate, brominated polycarbonate, brominated epoxy component, or brominated polystyrene, without special limitation on the types, and is more preferably brominated poly(meth) acrylate, brominated polycarbonate, or brominated epoxy compound.

Brominated phthalimide is preferably represented by Formula (1).

(1)

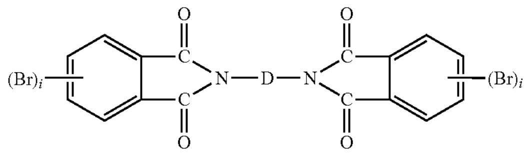

(In Formula (1), D represents a group composed of a combination of two or more groups selected from alkylene group, arylene group, $—S(=O)_2—$, $—C(=O)—$, and, $—O—$; and i represents an integer of 1 to 4.)

In Formula (1), D represents a group composed of a combination of two or more groups selected from alkylene group, arylene group, $—S(=O)_2—$, $—C(=O)—$, and, $—O—$; preferably represents a group composed of a combination of alkylene group or arylene group, with at least one of $—S(=O)_2—$, $—C(=O)—$, or, $—O—$; more preferably represents a group composed of a combination of alkylene group or arylene group, with one of $—S(=O)_2—$, $—C(=O)—$, or, $—O—$; wherein the combination more preferably contains alkylene group.

The group composed of a combination of alkylene group and —O— encompasses a combination of, for example, two alkylene groups and one-O-(the same will apply to other combinations). The alkylene group in D is preferably an alkylene group having 1 to 6 carbon atoms, and is more preferably a methylene group, an ethylene group, a propylene group, or a butylene group. The arylene group is preferably a phenylene group. i Represents an integer of 1 to 4, wherein 4 is preferred.

The brominated phthalimide represented by Formula (1) is exemplified by N,N'-bis(tetrabromophthalimide) ethane, N,N'-bis(tetrabromophthalimide) propane, N,N'-bis(tetrabromophthalimide) butane, N,N'-bis(tetrabromophthalimide) diethyl ether, N,N'-bis(tetrabromophthalimide)dipropyl ether, N,N'-bis(tetrabromophthalimide)dibutyl ether, N,N'-bis(tetrabromophthalimide)diphenylsulfone, N,N'-bis(tetrabromophthalimide)diphenylketone, and N,N'-bis(tetrabromophthalimide)diphenyl ether.

The brominated phthalimide represented by Formula (1) is preferably a brominated phthalimide represented by Formula (2).

(2)

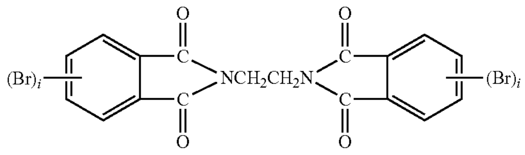

(In Formula (2), i represents an integer of 1 to 4.) i Represents an integer of 1 to 4, wherein 4 is preferred. The brominated poly(meth)acrylate is preferably a polymer obtainable by homo-polymerizing a bromine atom-containing benzyl(meth)acrylate , or copolymerizing two or more kinds thereof, or copolymerizing it with other vinyl-based monomer, wherein the bromine atom is bound to the benzene ring, with a number of binding per benzene ring of preferably 1 to 5, and particularly 4 or 5.

The bromine atom-containing benzyl acrylate is exemplified by pentabromobenzyl acrylate, tetrabromobenzyl acrylate, tribromobenzyl acrylate, and mixtures of these compounds. The bromine atom-containing benzyl methacrylate is exemplified by methacrylates corresponded to the aforementioned acrylates.

Such other vinyl-based monomer used for copolymerization with the bromine atom-containing benzyl(meth)acrylate is specifically exemplified by acrylic acid; acrylate esters such as methyl acrylate, ethyl acrylate, butyl acrylate, and benzyl acrylate; methacrylic acid; methacrylate esters such as methyl methacrylate, ethyl methacrylate, butyl methacrylate, and benzyl methacrylate; styrene; acrylonitrile; unsaturated carboxylic acids such as fumaric acid and maleic acid, or anhydrides thereof; vinyl acetate; and vinyl chloride.

These compounds are normally used in an amount not exceeding the equimolar amount of the bromine atom-containing benzyl(meth)acrylate, and particularly in a mole amount 0.5 times or less.

The vinyl-based monomer usable herein also includes xylene diacrylate, xylene dimethacrylate, tetrabromoxylene diacrylate, tetrabromoxylene dimethacrylate, butadiene, isoprene, and divinylbenzene. These compounds are normally usable in a mole amount 0.5 times or less the mole amount of the bromine atom-containing benzyl acrylate or benzyl methacrylate.

The brominated poly(meth)acrylate is preferably a polymer obtainable by homo-polymerizing a bromine atom-containing (meth)acrylate monomer which is particularly benzyl(meth)acrylate , or copolymerizing two or more kinds thereof, or copolymerizing it with other vinyl-based monomer. The bromine atom is bound to the benzene ring, with a number of binding per benzene ring of preferably 1 to 5, and particularly 4 or 5.

The brominated poly(meth)acrylate is preferably pentabromobenzyl poly(meth)acrylate for its high bromine content.

The brominated poly(meth)acrylate may have freely selectable molecular weight which may properly be determined, wherein the weight-average molecular weight (Mw) is preferably 3,000 or larger, more preferably 10,000 or larger, even more preferably 15,000 or larger, yet more preferably 20,000 or larger, and furthermore preferably 25,000 or larger. At or above the lower limit value, the obtainable formed article may tend to have higher mechanical strength. Meanwhile, the upper limit of the weight-average molecular weight (Mw) is preferably 100,000 or below, more preferably 80,000 or below, even more preferably 60,000 or below, yet more preferably 50,000 or below, and furthermore preferably 35,000 or below. At or below the upper limit value, the resin composition tends to further improve the fluidity.

The brominated polycarbonate preferably has a free bromine content of 0.05% by mass or more, and 0.20% by mass or less. Within such range, the resin composition tends to further improve the heat stability. The brominated polycarbonate also preferably has a chlorine atom content of 0.001% by mass or more, and 0.20% by mass or less. Within such range, corrosion resistance of die during forming or molding tends to further improve.

More specifically, the brominated polycarbonate is preferably a brominated polycarbonate obtainable typically from brominated bisphenol A, and particularly from tetrabromobisphenol A. The terminal structure thereof is exemplified by phenyl group, 4-t-butylphenyl group, and 2,4, 6-tribromophenyl group, among which 2,4, 6-tribromophenyl group is particularly preferred for the terminal group structure.

An average number of carbonate structural units in the brominated polycarbonate may be determined by proper selection, which is preferably 2 to 30, more preferably 3 to 15, and even more preferably 3 to 10.

The molecular weight of the brominated polycarbonate is freely selectable and may be determined by proper selection, wherein the viscosity-average molecular weight is preferably 1,000 to 20,000, and particularly preferably 2,000 to 10,000.

The brominated polycarbonate obtainable from the brominated bisphenol A is typically obtainable by an ordinary method of reacting brominated bisphenol with phosgene. Terminal blocker is exemplified by aromatic monohydroxy compound, which may be substituted with halogen or organic group.

The brominated epoxy compound is specifically exemplified by bisphenol A-type brominated epoxy compound represented by tetrabromobisphenol A epoxy compound, and glycidyl brominated bisphenol A epoxy compound.

The molecular weight of the brominated epoxy compound is freely selectable and may be determined by proper selection, wherein the weight-average molecular weight (Mw) is preferably 3,000 or larger, more preferably 10,000 or larger, even more preferably 13,000 or larger, yet more preferably 15,000 or larger, and furthermore preferably 18,000 or larger. At or above the lower limit value, the obtainable formed article may tend to have further enhanced mechanical strength. Meanwhile, the upper limit of the weight-average molecular weight (Mw) is preferably 100,000 or below, more preferably 80,000 or below, even more preferably 78,000 or below, yet more preferably 75,000 or below, and furthermore preferably 70,000 or below. At or below the upper limit value, the resin composition tends to further improve the fluidity The brominated epoxy compound preferably has an epoxy equivalent of 3,000 to 40,000 g/eq, which is more preferably 4,000 to 35,000 g/eq, and particularly preferably 10,000 to 30,000 g/eq.

The brominated epoxy compound used herein may alternatively be a brominated epoxy oligomer. In this case, a typical use of approximately 50% by mass or less of an oligomer having a Mw of 5,000 or smaller may properly control the flame retardance, mold releasability, and fluidity. The bromine atom content in the brominated epoxy compound is freely selectable, wherein the content is normally 10% by mass, in view of achieving a sufficient level of flame retardance, and is specifically 20% by mass or more, and particularly 30% by mass or more, with the upper limit value preferably controlled to 60% by mass, and particularly to 55% by mass or below.

The brominated polystyrene is preferably exemplified by a brominated polystyrene having a structural unit represented by Formula (3).

(3)

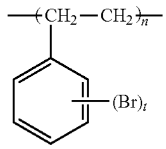

(In Formula (3), t represents an integer of 1 to 5, and n represents the number of structural units.)

The brominated polystyrene may be produced either by brominating polystyrene, or by polymerizing a brominated styrene monomer. A product obtained by polymerizing brominated styrene is preferred for its low content of free bromine (atom). Note that, in Formula (3), the CH group to which the brominated benzene is bound may be substituted by a methyl group. The brominated polystyrene may alternatively be a copolymer having other vinyl-based monomer copolymerized thereto. The vinyl-based monomer in this case is exemplified by styrene, α-methylstyrene, (meth)acrylonitrile, methyl(meth)acrylate, butadiene, and vinyl acetate. The brominated polystyrene used herein may alternatively be a monomaterial, or a mixture of two or more materials having different structures, or may have, in a single molecular chain thereof, units derived from styrene monomers having different numbers of bromine atom.

The brominated polystyrene is specifically exemplified by poly(4-bromostyrene), poly(2-bromostyrene), poly(3-bromostyrene), poly(2, 4-dibromostyrene), poly(2, 6-dibromostyrene), poly(2,5-dibromostyrene), poly(3,5-dibromostyrene), poly(2,4, 6-tribromostyrene), poly(2,4, 5-tribromostyrene), poly(2,3, 5-tribromostyrene), poly(4-bromo-α-methylstyrene), poly(2, 4-dibromo-α-methylstyrene), poly(2, 5-dibromo-α-methylstyrene), poly(2,4, 6-tribromo-α-methylstyrene), and poly(2,4, 5-tribromo-α-methylstyrene), among them particularly preferred are poly(2,4, 6-tribromostyrene), poly(2,4, 5-tribromostyrene), and polydibromostyrene and polytribromostyrene respectively having 2 and 3 bromine groups on average in the benzene ring.

The brominated polystyrene preferably has a number n (average degree of polymerization) of the structural unit in Formula (3) of 30 to 1,500, which is more preferably 150 to 1,000, and particularly preferably 300 to 800. The average degree of polymerization, if falls below 30, may make the blooming more likely to occur, meanwhile if exceeding 1,500, may tend to cause dispersion failure, making the mechanical property more likely to degrade. The brominated polystyrene preferably has a weight-average molecular weight (Mw) of 5,000 to 500,000, which is more preferably 10,000 to 500,000, even more preferably 10,000 to 300,000, yet more preferably 10,000 to 100,000, and furthermore preferably 10,000 to 70,000. In particular, the aforementioned polystyrene yielded by bromination preferably has a weight-average molecular weight (Mw) of 50,000 to 70,000, meanwhile the brominated polystyrene yielded by polymerization preferably has a weight-average molecular weight (Mw) of approximately 10,000 to 30,000. Note that the weight-average molecular weight (Mw) may be determined by GPC measurement, in terms of standard polystyrene equivalent value.

The bromine-containing flame retardant preferably has a bromine concentration of 45% by mass or more, which is more preferably 48% by mass or more, and even more preferably 50% by mass or more. At or above the lower limit value, the formed article may tend to effectively enhance the flame retardance. The upper limit value of the bromine concentration is preferably 75% by mass or below, more preferably 73% by mass or below, and even more preferably 71% by mass or below.

The metal phosphinate, when used as the flame retardant, may be of any type without special limitation, wherein preferred is a metal phosphinate having an anionic moiety represented by Formula (4) or (5), and having a cationic moiety whose metal ion is any of calcium, magnesium, aluminum or zinc.

(4)

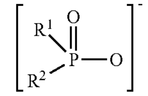

(5)

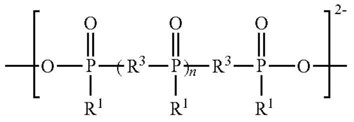

(In the formulae, each of $R^1$ and $R^2$ independently represents an alkyl group having 1 to 6 carbon atoms or an optionally substituted aryl group, ($R^1$) s may be same or different; $R^3$ represents an alkylene group having 1 to 10 carbon atoms, an optionally substituted arylene group, or group composed of combination of them, ($R^3$) s may be same or different; and n represents an integer of 0 to 2.)

The optionally substituted aryl group is preferably an optionally substituted phenyl group. When substituted, the substituent is preferably an alkyl group having 1 to 3 carbon atoms. The aryl group may also preferably unsubstituted. The optionally substituted arylene group is preferably an optionally substituted phenylene group. The optionally substituted arylene group is preferably unsubstituted, or preferably has an alkyl group having 1 to 3 carbon atoms (preferably methyl group) as the substituent.

In this embodiment, metal phosphinate represented by Formula (5) is preferred. In this embodiment, aluminum phosphinate is preferred.

The metal phosphinate is specifically exemplified by calcium dimethylphosphinate, magnesium dimethylphosphinate, aluminum dimethylphosphinate, zinc dimethylphosphinate, calcium ethylmethylphosphinate, magnesium ethylmethylphosphinate, aluminum ethylmethylphosphinate, zinc ethylmethylphosphinate, calcium diethylphosphinate, magnesium diethylphosphinate, aluminum diethylphosphinate, zinc diethylphosphinate, calcium methyl-n-propylphosphinate, magnesium methyl-n-propylphosphinate, aluminum methyl-n-propylphosphinate, zinc methyl-n-propylphosphinate, calcium methanedi(methylphosphinate), magnesium methanedi(methylphosphinate), aluminum methanebis(methylphosphinate), zinc methanebis (methylphosphinate), calcium benzene-1, 4-bis(methylphosphinate), magnesium benzene-1, 4-bis(methylphosphinate), aluminum benzene-1,4-bis(methylphosphinate), zinc benzene-1, 4-bis(methylphosphinate), calcium methylphenylphosphinate, magnesium methylphenylphosphinate, aluminum methylphenylphosphinate, zinc methylphenylphosphinate, calcium diphenylphosphinate, magnesium diphenylphosphinate, aluminum diphenylphosphinate, and zinc diphenylphosphinate.

Detail of the metal phosphinate may be understood referring to the description in paragraphs to of WO2010/010669, the content of which is incorporated herein by reference.

The lower limit value of the content of the flame retardant in the resin composition of this embodiment, per 100 parts by mass of the thermoplastic resin (preferably crystalline thermoplastic resin), is preferably 1.0 part by mass or above, more preferably 3.0 parts by mass or above, even more preferably 5.0 parts by mass or above, yet more preferably 7.0 parts by mass or above, and furthermore preferably 10.0 parts by mass or above. At or above the lower limit value, the obtainable formed article may tend to further improve the flame retardance. The upper limit value of the content of the flame retardant, per 100 parts by mass of the thermoplastic resin (preferably crystalline thermoplastic resin), is preferably 70.0 parts by mass or below, more preferably 60.0 parts by mass or below, even more preferably 50.0 parts by mass or below, yet more preferably 45.0 parts by mass, furthermore preferably 40.0 parts by mass or below, and again furthermore preferably 30.0 parts by mass or below. At or below the upper limit value, the obtainable formed article may more effectively suppress the mechanical strength from degrading. The resin composition of this embodiment may contain only one kind of, or two or more kinds of the flame retardant. When two or more kinds are contained, the total content preferably falls within any of the aforementioned ranges.

<Flame Retardant Auxiliary>

The resin composition of this embodiment preferably contains a flame retardant auxiliary, and more preferably contains an antimony compound. The flame retardant auxiliary (preferably antimony compound), when contained therein, interacts with the bromine-containing flame retardant, making the flame retardance tends to synergistically improve.

The antimony compound is preferably antimony trioxide (Sb203), antimony pentoxide (Sb205) or sodium antimonate. Among them, antimony trioxide is particularly preferred.

In this embodiment, mass ratio of bromine atom contained in the bromine-containing flame retardant and antimony atom contained in the antimony compound (Br/Sb) is preferably 0.3 or larger, and more preferably 1.0 or larger, meanwhile preferably 5.0 or smaller, and more preferably 4.0 or smaller. Within these ranges, the flame retardance desirably tends to be demonstrated more easily.

In the resin composition of this embodiment, the antimony compound is preferably blended in the form of a masterbatch with a thermoplastic resin. This makes the antimony compound more easily present in the thermoplastic resin phase, tends to improve the heat stability during melt kneading and forming process, tends to suppress the impact resistance from degrading, and tends to reduce variation of flame retardance and impact resistance. Content of the antimony compound in the masterbatch is preferably 20 to 90% by mass. The content of the antimony compound in the masterbatch is more preferably 30% by mass or more, even more preferably 40% by mass or more, yet more preferably 50% by mass or more, furthermore preferably 60% by mass or more, and particularly preferably 70% by mass or more.

Content of the flame retardant auxiliary (preferably antimony compound) in the resin composition of this embodiment, per 100 parts by mass of the thermoplastic resin, is preferably 0.1 parts by mass or more, more preferably 1.0 part by mass or more, even more preferably 2.0 parts by mass or more, and yet more preferably 3.0 parts by mass or more. At or above the lower limit value, the obtainable formed article may further improve the flame retardance. Meanwhile, the upper limit value of the content of the flame retardant auxiliary (preferably antimony compound), per 100 parts by mass of the thermoplastic resin, is preferably 20.0 parts by mass or below, more preferably 15.0 parts by mass or below, even more preferably 10.0 parts by mass or below, yet more preferably 8.0 parts by mass or below, and furthermore preferably 7.0 parts by mass or below. At or below the upper limit value, the obtainable formed article may tend to improve the mold releasability and impact resistance.

<Other Components>

The resin composition of this embodiment may contain some other optional components besides those described previously, without seriously undermining the desired physical properties. Such other components are exemplified by various resin additives. Only one of such other components may be contained, or two or more kinds are contained according to freely selectable combination and proportion.

Other components are more specifically exemplified by stabilizer, mold releasing agent, pigment, dye, UV absorber, antistatic agent, anti-clouding agent, anti-blocking agent, flow modifier, plasticizer, dispersion aid, and antibacterial agent. The resin composition of this embodiment preferably contains at least either stabilizer or mold releasing agent.

The resin composition of this embodiment is prepared so that the thermoplastic resin (preferably polybutylene terephthalate resin), the electromagnetic wave absorbing material (preferably carbon nanotube), the glass fiber, and other optionally blended components will total 100% by mass. In the resin composition of this embodiment, the total of the thermoplastic resin (preferably polybutylene terephthalate resin), the electromagnetic wave absorbing material (preferably carbon nanotube), and the glass fiber preferably accounts for 95% by mass or more of the resin composition. Again in the resin composition of this embodiment, the total of the thermoplastic resin (preferably polybutylene terephthalate resin), the electromagnetic wave absorbing material (preferably carbon nanotube), the glass fiber, the stabilizer, and the mold releasing agent preferably accounts for 99% by mass or more of the resin composition.

The resin composition of this embodiment may alternatively be structured to contain substantially no polycarbonate resin. The phrase " . . . contain substantially no polycarbonate resin" means that the content of the polycarbonate resin is 10% by mass or less of the thermoplastic resin contained in the resin composition, the percentage is preferably 5% by mass or smaller, more preferably 3% by mass or smaller, and even more preferably 1% by mass or smaller. The resin composition that contains substantially no polycarbonate resin is preferably used, particularly for a resin composition free of glass fiber.

«Stabilizer»

The resin composition of this embodiment may contain a stabilizer. The stabilizer is exemplified by hindered phenol-based compound, hindered amine-based compound, phosphorus-containing compound, and sulfur-containing stabilizer. Among them, preferred is hindered phenol-based compound. Combined use of the hindered phenol-based compound and the phosphorus-containing compound is also preferred.

The stabilizer may be understood referring to the description in paragraphs to of JP 2018-070722 A, description in paragraphs to of JP 2019-056035 A, and description in paragraphs to of WO 2017/038949, the contents of which are incorporated herein by reference.

The resin composition of this embodiment preferably contains 0.01 parts by mass or more of the stabilizer, per 100 parts by mass of the thermoplastic resin (preferably polybutylene terephthalate resin), wherein the content is more preferably 0.05 parts by mass or more, and even more preferably 0.08 parts by mass or more. The upper limit value of the content of the stabilizer is preferably 3 parts by mass or below, per 100 parts by mass of the thermoplastic resin (preferably polybutylene terephthalate resin), which is more preferably 2 parts by mass or below, and even more preferably 1 part by mass or below.

The resin composition of this embodiment may contain only one kind of, or two or more kinds of the stabilizer. When two or more kinds are contained, the total content preferably falls within any of the aforementioned ranges.

«Mold Releasing Agent»

The resin composition of this embodiment preferably contains a mold releasing agent.

A wide range of known mold releasing agent is applicable, among which esterified product of aliphatic carboxylic acid, paraffin wax, and polyethylene wax are preferred, and polyethylene wax is more preferred.

The mold releasing agent may be understood referring to the descriptions in paragraphs to of JA 2013-007058 A, in paragraphs to of JA 2018-070722 A, and in paragraphs to of JA 2019-123809 A, the contents of which are incorporated herein by reference.

The resin composition of this embodiment preferably contains 0.01 parts by mass or more of the mold releasing agent, per 100 parts by mass of the thermoplastic resin (preferably polybutylene terephthalate resin), wherein the content is more preferably 0.08 parts by mass or more, and even more preferably 0.2 parts by mass or more. The upper limit value of the content of the mold releasing agent is preferably 5 parts by mass or below, per 100 parts by mass of the thermoplastic resin (preferably polybutylene terephthalate resin), more preferably 3 parts by mass or below, even more preferably 1 part by mass or below, and yet more preferably 0.8 parts by mass or below.

The resin composition may contain only one kind of, or two or more kinds of the mold releasing agent. When two or more kinds are contained, the total content preferably falls within any of the aforementioned ranges.

<Physical Properties of Resin Composition>

The resin composition of this embodiment demonstrates high electromagnetic wave absorbance.

More specifically, the resin composition of this embodiment preferably demonstrates an absorbance at 76.5 GHz frequency of 40.0 to 100%, when formed to a thickness of 2 mm (for example in a size of 150 mm×150 mm×2 mm thick, or 100 mm×100 mm×2 mm thick), and determined by Equation (A).

$$\text{Absorbance (\%)} = 100 - \left(\frac{1}{10^{-R/10}} \times 100 + \frac{1}{10^{-T/10}} \times 100\right) \quad \text{Equation (A)}$$

(In Equation (A), R represents return loss measured by the free space method, and T represents transmission attenuation measured by the free space method.)

The absorbance is preferably 50.0% or larger, more preferably 55.0% or larger, even more preferably 60.0% or larger, and yet more preferably 65.0% or larger. An upper limit value of 90.0% or below, although ideally 100%, will be enough for satisfying performance requirement.

The resin composition of this embodiment preferably demonstrates low electromagnetic wave reflectance.

More specifically, the resin composition of this embodiment preferably demonstrates a reflectance at 76.5 GHz frequency of 40.0% or smaller, when formed to a thickness of 2 mm (for example in a size of 150 mm×150 mm×2 mm thick, or 100 mm×100 mm×2 mm thick), and determined by Equation (B).

$$\text{Reflectance (\%)} = \frac{1}{10^{-R/10}} \times 100 \quad \text{Equation (B)}$$

(In Equation (B), R represents return loss measured by the free space method.)

The reflectance is preferably 35.0% or smaller, more preferably 30.0% or smaller, and even more preferably 25.0% or smaller. A lower limit value of 1.0% or above, and further 10.0% or above, although ideally 0%, will be enough for satisfying performance requirement.

The resin composition of this embodiment preferably demonstrates low transmittance.

The resin composition of this embodiment preferably demonstrates a transmittance at 76.5 GHz frequency of 25.0 or smaller, which is more preferably 15% or smaller, when formed to a thickness of 2 mm (for example in a size of 150 mm×150 mm×2 mm thick, or 100 mm×100 mm×2 mm thick), and determined by Equation (C).

$$\text{Transmittance (\%)} = \frac{1}{10^{-T/10}} \times 100 \quad \text{Equation (C)}$$

(In Equation (C), T represents transmission attenuation measured by the free space method.)

The transmittance is preferably smaller than 25.0%, more preferably smaller than 20.0%, even more preferably 19.0% or smaller, yet more preferably 15.0% or smaller, furthermore preferably 12.0% or smaller, again furthermore preferably 10.0% or smaller, particularly preferably smaller than 10.0%, and even may be 5.0% or smaller. A lower limit value of 0.5 or above, and further 1.0% or above, although ideally 0%, will be enough for satisfying performance requirement.

The resin composition of this embodiment also preferably has small frequency dependence of electromagnetic wave. More specifically, the resin composition of this embodiment preferably demonstrates a difference between a maximum value and a minimum value of reflectance in the range from 70 GHz to 80 GHZ frequency of 20.0% or smaller, when formed to a size of 150 mm×150 mm×2 mm thick and determined by Equation (B).

$$\text{Reflectance (\%)} = \frac{1}{10^{-R/10}} \times 100 \quad \text{Equation (B)}$$

(In Equation (B), R represents return loss measured by the free space method.)

The difference between the maximum value and the minimum value of reflectance is preferably 18.0% or smaller, more preferably 17.0% or smaller, even more preferably 12.0% or smaller, and yet more preferably 10.0% or smaller. A lower limit value of 1.0% or above, although ideally 0%, will be enough for satisfying performance requirement.

The resin composition of this embodiment preferably satisfies the absorbance determined by Equation (A), the difference between a maximum value and a minimum value of reflectance in the range from 70 GHZ to 80 GHz frequency determined by Equation (B), as well as, the reflectance determined by Equation (B), and/or, the transmittance determined by Equation (C).

The resin composition of this embodiment is also preferably a resin composition that contains the thermoplastic resin, and preferably demonstrates an absorbance determined by Equation (A) of 60.0% or larger, a reflectance determined by Equation (B) of 30.0% or smaller, and a transmittance determined by Equation (C) of 10.0% or smaller, and intended for use as the electromagnetic wave absorber.

A particularly preferred mode of the resin composition of this embodiment relates to a resin composition that contains 0.1 to 10.0 parts by mass of the electromagnetic wave absorbing material (preferably carbon nanotube), per 100 parts by mass of the polybutylene terephthalate resin; that demonstrates an absorbance at 76.5 GHz frequency of 40.0 to 100%, when formed to a thickness of 2 mm (for example in a size of 150 mm×150 mm×2 mm thick, or 100 mm×100 mm×2 mm thick), and determined by Equation (A); and that demonstrates a difference between a maximum value and a minimum value of reflectance in the range from 70 GHz to 80 GHz frequency of 20.0% or smaller, when formed to a thickness of 2 mm (for example in a size of 150 mm×150 mm×2 mm thick, or 100 mm×100 mm×2 mm thick), and determined by Equation (B); being intended for use as an electromagnetic wave absorber.

The resin composition further preferably satisfies the reflectance determined by Equation (B), and/or, the transmittance determined by Equation (C).

The resin composition of this embodiment preferably excels in mechanical strength.

For example, the resin composition of this embodiment preferably demonstrates a maximum tensile strength of 50 MPa or larger, when formed into an ISO multi-purpose test specimen (4 mm thick), and measured in compliance with ISO527-1 and ISO527-2, which is more preferably 60 MPa or larger, and even more preferably, 130 MPa or larger. A maximum tensile strength of 200 MPa or smaller for example is at the practical level, although the upper limit value is not specifically limited.

The resin composition of this embodiment also preferably excels in flexural properties.

More specifically, the resin composition of this embodiment preferably demonstrates a flexural strength of 50 MPa or larger, when formed into an ISO multi-purpose test specimen (4 mm thick), which is more preferably 70 MPa or larger, even more preferably 180 MPa or larger, and yet more preferably 190 MPa or larger. A flexural strength of 280 MPa or smaller for example is at the practical level, although the upper limit value is not specifically limited.

The resin composition of this embodiment, when formed into an ISO multi-purpose test specimen (4 mm thick), preferably demonstrates a flexural modulus of 1,500 MPa or larger, which is more preferably 2,000 MPa or larger, even more preferably 8,000 MPa or larger, yet more preferably 9,000 MPa or larger, and furthermore preferably 10,000 MPa or larger. A flexural modulus of 14,000 MPa or smaller for example is at the practical level, although the upper limit value is not specifically limited.

The resin composition of this embodiment, when containing the flame retardant, preferably excels in the flame retardance.

More specifically, the resin composition of this embodiment is preferably rated to be V-0 or V-1, when formed into a 0.8 mm-thick test specimen, and measured by the UL94 combustion test, wherein the rating is more preferably V-0.

The resin composition of this embodiment preferably excels in impact resistance.

More specifically, the resin composition of this embodiment preferably demonstrates a notched Charpy impact strength of 4.0 $kJ/m^2$ or larger, when formed into an ISO tensile test specimen (4 mm thick), and measured in compliance with ISO179, wherein the value is more preferably 5.0 $KJ/m^2$ or larger. A notched Charpy impact strength is typically 20.0 $KJ/m^2$ or smaller, and even may be 12.0 $KJ/m^2$ or smaller, although the upper limit value is not specifically limited.

The resin composition of this embodiment also preferably demonstrates a surface resistivity of $1.0\times10^{11}$ Ω or larger, when formed to a size of 100 mm×100 mm×2 mm and measured in compliance with IEC60093, which is more preferably $1.0\times10^{16}$ Ω or smaller. The resin composition of this embodiment also preferably demonstrates a volume resistivity of $1.0\times10^{10}$ Ω or larger, when formed to a size of 100 mm×100 mm×2 mm and measured in compliance with IEC60093, which is more preferably $1.0\times10^{17}$ Ω or smaller. Details of the method of measurement will be described in EXAMPLES.

<Method for Producing Resin Composition>

The resin composition of this embodiment may be produced by any of ordinary methods for preparing resin composition that contains thermoplastic resin, typically by placing the thermoplastic resin (preferably polybutylene terephthalate resin), the electromagnetic wave absorbing material (preferably carbon nanotube), and other optionally-blended component (glass fiber, etc.) into an extruder, followed by melt kneading. To the extruder, the individual components may be preliminarily mixed and then fed en bloc; or, the individual components may be fed through a feeder without preliminarily mixing them, or after preliminarily mixing only a part of them. The extruder may be either a single-screw extruder or a twin-screw extruder. Alternatively, a part of the component, such as electromagnetic wave absorbing material (preferably carbon nanotube), may be melt-kneaded with a resin component (for example, polybutylene terephthalate resin) to prepare a masterbatch, to which the residual components may be blended and melt-kneaded.

The glass fiber, when blended, is preferably side-fed through a side feeder arranged in the middle of a cylinder of the extruder.

Heating temperature during the melt-kneading is properly selectable usually within the range from 170 to 350° C.

<Method for Manufacturing Electromagnetic Wave Absorber>

Method for manufacturing the electromagnetic wave absorber of this embodiment is freely selectable, without special limitation, from known forming/molding methods usually employed for resin composition that includes thermoplastic resin. The method is exemplified by injection molding, ultra-high-speed injection molding, injection compression molding, two color molding, hollow molding such as gas-assisted molding, molding with use of heat insulation dies, molding with use of rapid heating dies, foam molding (including supercritical fluid), insert molding, IMC (in-mold coating) molding, extrusion molding, sheet forming, thermoforming, rotational molding, laminate molding, press molding and blow molding. Among them, injection molding is preferred.

<Applications>

The electromagnetic wave absorber of this embodiment is formed of the resin composition of this embodiment. That is, the resin composition of this embodiment is intended for use as an electromagnetic wave absorber (also referred to as electromagnetic wave absorbing member), more preferably as an electromagnetic wave absorber adapted to at least the frequency range from 60 to 90 GHz, and even more preferably as an electromagnetic wave absorber adapted to at least the frequency range from 70 to 80 GHz. This sort of electromagnetic wave absorber is preferably applicable to radar, and more specifically to enclosure, cover and so forth for a millimeter-wave radar.

The electromagnetic wave absorber of this embodiment is suitably applicable to vehicle-borne millimeter-wave radar used for automatic brake control device, adaptive cruise control device, pedestrian accident reducing steering device, erroneous start prevention control system, pedal misapplication prevention device, rear vehicle monitoring device, lane keeping assist system, rear-end collision prevention device, parking assist device, and vehicle periphery monitoring device; railroad/aviation radar used for platform monitoring/level crossing obstacle detection device, contents-in-train transmitter, tram/railroad collision prevention device, and airport runway foreign object detection device; millimeter-wave radar for traffic infrastructure such as crossing monitor device, and elevator monitor; millimeter-wave radar for various security devices; millimeter-wave for medical/nursing care such as child/elderly monitoring system; and millimeter-wave radar for transmitting various information contents.

EXAMPLES

This invention will further be detailed referring to Examples. All materials, amounts of consumption, proportions, process details and procedures described in Examples below may suitably be modified, without departing from the spirit of this invention. Hence, the scope of this invention is by no means limited to specific Examples below.

In a case where any measuring instrument used in Examples become unavailable typically due to discontinuation, the measurement may be conducted with use of other instrument having equivalent performances.

Raw Materials

Raw materials summarized below were used.

TABLE 1

| Component | Symbol | |
|---|---|---|
| Polybutylene terephthalate resin (PBT) | a-1 | Polybutylene terephthalate resin (PBT)<br>Product name: Novaduran (registered trademark) 5008, from Mitsubishi Engineering-Plastics Corporation<br>Intrinsic viscosity: 0.85 dL/g |
| Polypropylene resin | a-2 | "Novatec EA8", from Japan Polypropylene Corporation<br>MFR: 0.5 g/10 min |
| Polyamide resin | a-3 | "UBE Nylon 1010X", from UBE Corporation |
| Polycarbonate resin | a-4 | Polycarbonate resin<br>"lupilon H4000", from Mitsubishi Engineering-Plastics Corporation<br>Mv = 16000 |
| Polystyrene resin | a-5 | Polystyrene resin<br>Product name: HT478, from PS Japan Corporation<br>Mw: 200,000, MFR: 3.2 g/10 min |
| Multi-layered carbon | b-1-1 | Multi-layered carbon nanotube masterbatch<br>15% by mass, PBT-based<br>"Plasticyl PBT150", from Nanocyl S.A. |
| nanotube | b-1-2 | Multi-layered carbon nanotube masterbatch<br>20% by mass, PP-based<br>'Plasticyl PP2001", from Nanocyl S.A. |
| masterbatch | b-1-3 | Multi-layered carbon nanotube masterbatch<br>15% by mass, PA6-based<br>'Plasticyl PA1503", from Nanocyl S.A. |
| Carbonaceous | b1-x1 | Masterbatch preliminarily compounding 80% by mass of "Novaduran 5008" and 20% by mass of "Carbon black #650" from Mitsubishi Chemical Corporation |
| electromagnetic | b1-x2 | Ketjen black masterbatch<br>15% by mass, PBT-based<br>"FD9035K", from Lion Specialty Chemicals Co., Ltd. |
| wave absorbing | b1-x3 | Masterbatch preliminarily compounding 65% by mass of "Novaduran 5510", 17% by mass of "PC99-300M" from Ito Graphite Co., Ltd., and 18% by mass of "EC-50" from Ito Graphite Co., Ltd. |
| material | b1-x4 | PAN-based carbon fiber<br>Number-average fiber diameter: 6 um<br>"TR06UL" from Mitsubishi Chemical Corporation |

TABLE 2

| Component | Symbol | |
|---|---|---|
| Reinforcing material (glass fiber) | b-2 | Glass fiber, product name: T-127, from Nippon Electric Glass Co., Ltd. Chopped strand glass fiber with number-average fiber diameter of 13 um, treated with novolac-type epoxy resin |
| Epoxy compound | c-1 | Bisphenol-A type epoxy compound Product name: EP-17, from ADEKA Corporation |
| | c-2 | Bisphenol-A type epoxy compound "jer1003", from Mitsubishi Chemical Corporation, epoxy compound |
| Stabilizer | d-1 | Hindered phenol-based stabilizer Pentaerythritol tetrakis[3-(3,5-di-tert -butyl-4-hydroxyphenyl) propionate] Product name: ADK STAB AO-60, from ADEKA Corporation |
| | d-2 | Phosphorus-containing stabilizer, octadecyl acid phosphate "AX-71", from ADEKA Corporation |
| Mold releasing agent | e-1 | Polyethylene-based wax, "Hi-Wax 100P", from Mitsui Chemicals, Inc. Dropping point: 116° C. |
| Flame retardant auxiliary (antimony compound) | f-1 | Antimony trioxide masterbatch 80% by mass of antimony trioxide, PBT-based "Composition 405001", from SICA S.A. |
| Flame retardant | g-1 | Tetrabromobisphenol A-based epoxy compound Product name: CXB2000H, from Woojin Copolymer Bromine concentration: 52% by mass, Mw: 20,000 |
| | g-2 | Pentabromobenzyl polyacrylate Product name: FR1025, from ICL Japan Ltd. Bromine concentration: 70% by mass, Mw: 31,000 |
| | g-3 | Brominated polycarbonate "FR-53", from Mitsubishi Gas Chemical Company, Inc. Bromine concentration: 58% by mass, free bromine content : 0.11% by mass, chlorine compound content: 0.02% by mass |

Examples 1-1 to 1-8, Comparative Examples 1-1 to 1-10

<Production of Resin Composition (Pellet)>

From among the raw materials listed in Table 1 or 2 above, the individual components selected as summarized in Tables below were placed in a stainless steel tumbler, and mixed under stirring for one hour. The obtained mixture was fed into an intermeshed co-rotation twin screw extruder ("TEX-30x", from Japan Steel Works, Ltd., screw diameter=32 mm, L/D=42) through a main feeding port. The content was plasticized at a barrel preset temperature in the first kneading zone of 260° C., the glass fiber whose proportion being given in Tables below was fed through a side feeder, the barrel temperature after addition of the glass fiber was set to 250° C., the content was melt-kneaded at a discharge rate of 40 kg/h, and a screw speed of 200 rpm, and then extruded into strands through a four-hole nozzle (4 mm diameter round hole, 1.5 cm long). The extruded strands were introduced into a water bath for cooling, and then inserted to a pelletizer for cutting, to obtain a resin composition (pellet).

<Maximum Tensile Strength>

The thus obtained resin pellet was dried at 120° C. for 5 hours, and then injection-molded into an ISO multi-purpose test specimen (4 mm thick) with use of an injection molding machine ("J85AD", from Japan Steel Works, Ltd.), at a cylinder temperature of 250° C., and a die temperature of 80° C.

With use of the thus molded multi-purpose ISO multi-purpose test specimen, maximum tensile strength (in MPa) and tensile modulus (in MPa) were measured in compliance with IS0527-1 and ISO527-2.

<Increase Rate of Maximum Tensile Strength>

Increase rate of the maximum tensile strength, relative to a case where carbon black was used as the carbonaceous electromagnetic wave absorbing material, was estimated. In this study, the increase rate was estimated among the resins with the same composition. That is, the increase rate in Example 1-1, Example 1-2, Comparative Example 1-4, Comparative Example 1-5, and Comparative Example 1-8 was estimated based on the maximum tensile strength in Comparative Example 1-1; the increase rate in Example 1-3, Example 1-4, Comparative Example 1-6, and Comparative Example 1-9 was estimated based on the maximum tensile strength in Comparative Example 1-2; and the increase rate in Example 1-5, Example 1-6, Comparative Example 1-7, and Comparative Example 1-10 was estimated based on the maximum tensile strength in Comparative Example 1-3.

For example, Example 1-1 demonstrates a maximum tensile strength of 147 MPa, meanwhile Comparative Example 1-1 demonstrates a maximum tensile strength of 134 MPa, so that the increase rate of Example 1-1 is given as (147/134)×100=110 (%).

<Flexural Properties>

The thus obtained resin pellet was dried at 120° C. for 5 hours, and then injection-molded into an ISO multi-purpose test specimen (4 mm thick) with use of an injection molding machine ("J85AD", from Japan Steel Works, Ltd.), at a cylinder temperature of 250° C., and a die temperature of 80° C.

With use of the thus molded multi-purpose ISO multi-purpose test specimen, flexural strength (in MPa) and flexural modulus (in MPa) were measured in compliance with ISO178.

<Low Warpage>

The resin composition pellet was dried at 120° C. for 5 hours, and then injection-molded into a 150 mm×150 mm×2 mm square plate test specimen, with use of an injection molding machine ("EC160", from Shibaura Machine Co., Ltd.), at a cylinder temperature of 260° C., and a die temperature of 80° C., and warpage (mm) of the formed article was measured. Low warpage was judged according to the criteria below. Now, the warpage is defined by placing the 150 mm×150 mm×2 mm square plate on a flat plane while keeping three apexes in contact with the plane, and by finding a straight-line distance between the residual apex and the flat plane.

A: warpage<3 mm

B: 3 mm≤warpage<15 mm

C: 15 mm S warpage

<Absorbance, Transmittance, and Reflectance>

The thus obtained resin pellet was injection-molded into a 150 mm×150 mm×2 mm thick test specimen, with use of an injection molding machine ("EC160", from Shibaura Machine Co., Ltd.), at a cylinder temperature of 260° C., and a die temperature of 80° C. With use of the obtained test specimen, absorbance determined by Equation (A), reflectance determined by Equation (B), and, transmittance determined by Equation (C), all at 76.5 GHZ frequency, were measured as described below.

A network analyzer "MS4647B Vector Network Analyzer", from Anritsu Corporation was used for the measurement.

The test specimen was measured while aligning the transverse direction (TD) of the molded article in parallel with the direction of electric field.

$$\text{Absorbance (\%)} = 100 - \left( \frac{1}{10^{-R/10}} \times 100 + \frac{1}{10^{-T/10}} \times 100 \right) \qquad \text{Equation (A)}$$

(In Equation (A), R represents return loss measured by the free space method, and T represents transmission attenuation measured by the free space method.)

$$\text{Reflectance (\%)} = \frac{1}{10^{-R/10}} \times 100 \qquad \text{Equation (B)}$$

(In Equation (B), R represents return loss measured by the free space method.)

$$\text{Transmittance (\%)} = \frac{1}{10^{-T/10}} \times 100 \qquad \text{Equation (C)}$$

(In Equation (C), T represents transmission attenuation measured by the free space method.)

<Frequency Dependence of Reflectance>

The thus obtained test specimen was subjected to measurement of reflectance over the range from 70 to 80 GHZ frequency, and difference between the maximum reflectance and the minimum reflectance was calculated. The smaller the difference between the maximum reflectance and the minimum reflectance, the smaller the frequency dependence, meaning that the obtained resin composition is stable.

<Judgment of Electromagnetic Wave Absorptivity>

The performance was judged as below, on the basis of the thus measured absorbance, reflectance, and, transmittance.

A: all of (1) to (3) below satisfied.

B: at least (1) below satisfied (excluding the case applicable to (A)).

C: other than A and B (1) absorbance≥60.0%

(2) reflectance≤30.0%

(3) transmittance≤10.0%

<Overall Rating of Electromagnetic Wave Absorptivity and Mechanical Strength>

Overall rating was made as below, on the basis of the thus measured absorbance, reflectance, transmittance, low warpage, maximum tensile strength, and flexural strength.

6: All of (1) to (6) below satisfied.

5: Five of (1) to (6) below satisfied.

4: Four of (1) to (6) below satisfied.

3: Three of (1) to (6) below satisfied.

2: Two of (1) to (6) below satisfied.

1: One of (1) to (6) below satisfied.

(1) absorbance≥60.0%

(2) reflectance≤30.0%

(3) transmittance≤10.0%

(4) low warpage rated as A or B (5) maximum tensile strength≥130 MPa (6) flexural strength≥190 MPa

TABLE 3

| | Item | Unit | Example 1-1 | Example 1-2 | Example 1-3 | Example 1-3 (*) | Example 1-4 | Example 1-4 (*) |
|---|---|---|---|---|---|---|---|---|
| Chemical composition | (a-1) PBT | parts by mass | 100.0 | 100.0 | 100.0 | 62.5 | 100.0 | 65.0 |
| | (a-2) Polypropylene resin | | | | | | | |
| | (a-3) Polyamide resin | | | | | | | |
| | (a-4) Polycarbonate resin | | | | 60.0 | 37.5 | 53.8 | 35.0 |
| | (a-5) Polystyrene resin HT478 | | | | | | | |
| | (b-1-1) Multi-layered carbon nanotube | | 1.1 | 2.2 | 1.8 | 1.1 | 3.4 | 2.2 |
| | (b-1-2) Multi-layered carbon nanotube | | | | | | | |
| | (b-1-3) Multi-layered carbon nanotube | | | | | | | |
| | (b1-x1) Carbon black | | | | | | | |
| | (b1-x2) Ketjen black | | | | | | | |
| | (b1-x3) Graphite | | | | | | | |
| | (b1-x4) Carbon fiber | | | | | | | |
| | (b-2) Glass fiber T-127 | | 43.8 | 44.3 | 70.2 | 44.3 | 68.2 | 44.3 |
| | (c-1) Epoxy resin EP-17 | | 0.6 | 0.6 | 0.9 | 0.6 | 0.9 | 0.6 |
| | (d-1) Stabilizer AO-60 | | 0.3 | 0.3 | 0.5 | 0.3 | 0.5 | 0.3 |
| | (d-2) Stabilizer AX-71 | | | | 0.2 | 0.2 | 0.2 | 0.2 |
| | (e-1) Mold releasing agent | | 0.3 | 0.3 | 0.5 | 0.3 | 0.5 | 0.3 |
| | CNT/GF (mass ratio) | | 0.03 | 0.06 | 0.03 | | 0.06 | |
| Evaluation | Maximum tensile strength | MPa | 147 | 151 | 138 | | 137 | |
| | Increase rate of maximum tensile strength | % | 110 | 113 | 107 | | 106 | |
| | Flexural strength | MPa | 228 | 234 | 204 | | 207 | |
| | Flexural modulus | MPa | 9650 | 10080 | 9560 | | 10190 | |

TABLE 3-continued

| | Item | Unit | Example 1-1 | Example 1-2 | Example 1-3 | Example 1-3 (*) | Example 1-4 | Example 1-4 (*) |
|---|---|---|---|---|---|---|---|---|
| | Low warpage | Rating | B | B | A | | A | |
| | Absorbance at 76.5 GHz | % | 66.9 | 76.1 | 70.9 | | 75.6 | |
| | Reflectance at 76.5 GHz | % | 22.3 | 21.8 | 19.3 | | 22.6 | |
| | Transmittance at 76.5 GHz | % | 10.8 | 2.2 | 9.9 | | 1.8 | |
| | Frequency dependence of reflectance | | 13.0 | 11.1 | 16.0 | | 9.9 | |
| | Rating of electromagnetic wave absorptivity | Rating | B | A | A | | A | |
| | Overall rating of electromagnetic wave absorptivity and mechanical strength | Rating | 4 | 5 | 6 | | 6 | |

TABLE 4

| | Item | Unit | Example 1-5 | Example 1-5 (*) | Example 1-6 | Example 1-6 (*) | Example 1-7 | Example 1-8 |
|---|---|---|---|---|---|---|---|---|
| Chemical composition | (a-1) PBT | parts by mass | 100.0 | 62.5 | 100.0 | 65.0 | | |
| | (a-2) Polypropylene resin | | | | | | 100.0 | |
| | (a-3) Polyamide resin | | | | | | | 100.0 |
| | (a-4) Polycarbonate resin | | 15.0 | 9.4 | 13.4 | 8.7 | | |
| | (a-5) Polystyrene resin HT478 | | 45.0 | 28.1 | 40.3 | 26.3 | | |
| | (b-1-1) Multi-layered carbon nanotube | | 1.8 | 1.1 | 3.4 | 2.2 | | |
| | (b-1-2) Multi-layered carbon nanotube | | | | | | 2.2 | |
| | (b-1-3) Multi-layered carbon nanotube | | | | | | | 2.2 |
| | (b1-x1) Carbon black | | | | | | | |
| | (b1-x2) Ketjen black | | | | | | | |
| | (b1-x3) Graphite | | | | | | | |
| | (b1-x4) Carbon fiber | | | | | | | |
| | (b-2) Glass fiber T-127 | | 70.2 | 44.3 | 68.2 | 44.3 | 44.4 | 44.4 |
| | (c-1) Epoxy resin EP-17 | | 0.9 | 0.6 | 0.9 | 0.6 | 0.7 | 0.7 |
| | (d-1) Stabilizer AO-60 | | 0.5 | 0.3 | 0.5 | 0.3 | 0.3 | 0.3 |
| | (d-2) Stabilizer AX-71 | | 0.2 | 0.2 | 0.2 | 0.2 | | |
| | (e-1) Mold releasing agent | | 0.5 | 0.3 | 0.5 | 0.3 | 0.3 | 0.3 |
| | CNT/GF (mass ratio) | | 0.03 | | 0.06 | | 0.06 | 0.06 |
| Evaluation | Maximum tensile strength | MPa | 132 | | 131 | | — | — |
| | Increase rate of maximum tensile strength | % | 107 | | 107 | | — | — |
| | Flexural strength | MPa | 200 | | 194 | | — | — |
| | Flexural modulus | MPa | 9740 | | 10050 | | — | — |
| | Low warpage | Rating | A | | A | | — | — |
| | Absorbance at 76.5 GHz | % | 69.1 | | 77.5 | | 66.5 | 61.7 |
| | Reflectance at 76.5 GHz | % | 23.2 | | 20.8 | | 16.2 | 36.0 |
| | Transmittance at 76.5 GHz | % | 7.6 | | 1.7 | | 17.3 | 2.4 |
| | Frequency dependence of reflectance | | 9.8 | | 14.0 | | 7.8 | 12.4 |
| | Rating of electromagnetic wave absorptivity | Rating | A | | A | | A | A |
| | Overall rating of electromagnetic wave absorptivity and mechanical strength | Rating | 6 | | 6 | | — | — |

TABLE 5

| | Item | Unit | Comparative Example 1-1 | Comparative Example 1-2 | Comparative Example 1-2 (*) | Comparative Example 1-3 | Comparative Example 1-3 (*) | Comparative Example 1-4 | Comparative Example 1-5 |
|---|---|---|---|---|---|---|---|---|---|
| Chemical composition | (a-1) PBT | parts by mass | 100.0 | 100.0 | 63.5 | 100.0 | 63.6 | 100.0 | 100.0 |
| | (a-2) Polypropylene resin | | | | | | | | |
| | (a-3) Polyamide resin | | | | | | | | |
| | (a-4) Polycarbonate resin | | | 57.4 | 36.5 | 14.3 | 9.1 | | |
| | (a-5) Polystyrene resin HT478 | | | | | 43.0 | 27.3 | | |
| | (b-1-1) Multi-layered carbon nanotube | | | | | | | | |
| | (b-1-2) Multi-layered carbon nanotube | | | | | | | | |
| | (b-1-3) Multi-layered carbon nanotube | | | | | | | | |
| | (b1-x1) Carbon black | | 2.2 | 3.5 | 2.2 | 3.5 | 2.2 | | |
| | (b1-x2) Ketjen black | | | | | | | 2.2 | |
| | (b1-x3) Graphite | | | | | | | | 2.2 |

TABLE 5-continued

| | Item | Unit | Comparative Example 1-1 | Comparative Example 1-2 | Comparative Example 1-2 (*) | Comparative Example 1-3 | Comparative Example 1-3 (*) | Comparative Example 1-4 | Comparative Example 1-5 |
|---|---|---|---|---|---|---|---|---|---|
| | (b1-x4) Carbon fiber | | | | | | | | |
| | (b-2) Glass fiber T-127 | | 44.3 | 69.8 | 44.3 | 69.8 | 44.3 | 44.3 | 44.3 |
| | (c-1) Epoxy resin EP-17 | | 0.6 | 0.9 | 0.9 | 0.9 | 0.9 | 0.6 | 0.6 |
| | (d-1) Stabilizer AO-60 | | 0.3 | 0.5 | 0.3 | 0.5 | 0.3 | 0.3 | 0.3 |
| | (d-2) Stabilizer AX-71 | | | 0.2 | 0.2 | 0.2 | 0.2 | | |
| | (e-1) Mold releasing agent | | 0.3 | 0.5 | 0.3 | 0.5 | 0.3 | 0.3 | 0.3 |
| | CNT/GF (mass ratio) | | — | — | | — | | — | — |
| Evaluation | Maximum tensile strength | MPa | 134 | 129 | | 123 | | 138 | 133 |
| | Increase rate of maximum tensile strength | % | — | — | | — | | 103 | 99 |
| | Flexural strength | MPa | 205 | 190 | | 186 | | 211 | 206 |
| | Flexural modulus | MPa | 9410 | 9380 | | 9300 | | 9380 | 9520 |
| | Low warpage | Rating | B | A | | A | | B | B |
| | Absorbance at 76.5 GHz | % | 27.5 | 16.1 | | 15.6 | | 26.2 | 14.2 |
| | Reflectance at 76.5 GHz | % | 14.8 | 8.5 | | 0.3 | | 19.9 | 42.5 |
| | Transmittance at 76.5 GHz | % | 57.7 | 75.3 | | 84.1 | | 53.8 | 43.3 |
| | Frequency dependence of reflectance | | 21.6 | 21.7 | | 28.7 | | 25.8 | 42.7 |
| | Rating of electromagnetic wave absorptivity | Rating | C | C | | C | | C | C |
| | Overall rating of electromagnetic wave absorptivity and mechanical strength | Rating | 3 | 3 | | 2 | | 3 | 3 |

TABLE 6

| | Item | Unit | Comparative Example 1-6 | Comparative Example 1-6 (*) | Comparative Example 1-7 | Comparative Example 1-7 (*) |
|---|---|---|---|---|---|---|
| Chemical composition | (a-1) PBT | parts by mass | 100.0 | 61.7 | 100.0 | 61.6 |
| | (a-2) Polypropylene resin | | | | | |
| | (a-3) Polyamide resin | | | | | |
| | (a-4) Polycarbonate resin | | 62.2 | 38.3 | 15.6 | 9.6 |
| | (a-5) Polystyrene resin HT478 | | | | 46.7 | 28.8 |
| | (b-1-1) Multi-layered carbon nanotube | | | | | |
| | (b-1-2) Multi-layered carbon nanotube | | | | | |
| | (b-1-3) Multi-layered carbon nanotube | | | | | |
| | (b1-x1) Carbon black | | | | | |
| | (b1-x2) Ketjen black | | | | | |
| | (b1-x3) Graphite | | 3.6 | 2.2 | 3.6 | 2.2 |
| | (b1-x4) Carbon fiber | | | | | |
| | (b-2) Glass fiber T-127 | | 72.0 | 44.3 | 72.0 | 44.3 |
| | (c-1) Epoxy resin EP-17 | | 1.0 | 1.0 | 1.0 | 1.0 |
| | (d-1) Stabilizer AO-60 | | 0.5 | 0.3 | 0.5 | 0.3 |
| | (d-2) Stabilizer AX-71 | | 0.2 | 0.2 | 0.2 | 0.2 |
| | (e-1) Mold releasing agent | | 0.5 | 0.3 | 0.5 | 0.3 |
| | CNT/GF (mass ratio) | | — | | — | |
| Evaluation | Maximum tensile strength | MPa | 133 | | 121 | |
| | Increase rate of maximum tensile strength | % | 103 | | 98 | |
| | Flexural strength | MPa | 197 | | 183 | |
| | Flexural modulus | MPa | 9820 | | 9520 | |
| | Low warpage | Rating | A | | A | |
| | Absorbance at 76.5 GHz | % | 13.8 | | 15.1 | |
| | Reflectance at 76.5 GHz | % | 42.8 | | 36.3 | |
| | Transmittance at 76.5 GHz | % | 43.5 | | 48.6 | |
| | Frequency dependence of reflectance | | 42.9 | | 39.6 | |

TABLE 6-continued

| | | | | | | |
|---|---|---|---|---|---|---|
| | Rating of electro-magnetic wave absorptivity | Rating | C | | C | |
| | Overall rating of electromagnetic wave absorptivity and mechanical strength | Rating | 3 | | 2 | |

| | Item | Comparative Example 1-8 | Comparative Example 1-9 | Comparative Example 1-9 (*) | Comparative Example 1-10 | Comparative Example 1-10 (*) |
|---|---|---|---|---|---|---|
| Chemical composition | (a-1) PBT | 100.0 | 100.0 | 60.0 | 100.0 | 60.0 |
| | (a-2) Polypropylene resin | | | | | |
| | (a-3) Polyamide resin | | | | | |
| | (a-4) Polycarbonate resin | | 66.7 | 40.0 | 16.7 | 10.0 |
| | (a-5) Polystyrene resin HT478 | | | | 50.0 | 30.0 |
| | (b-1-1) Multi-layered carbon nanotube | | | | | |
| | (b-1-2) Multi-layered carbon nanotube | | | | | |
| | (b-1-3) Multi-layered carbon nanotube | | | | | |
| | (b1-x1) Carbon black | | | | | |
| | (b1-x2) Ketjen black | | | | | |
| | (b1-x3) Graphite | | | | | |
| | (b1-x4) Carbon fiber | 2.2 | 3.6 | 2.2 | 3.6 | 2.2 |
| | (b-2) Glass fiber T-127 | 44.3 | 74.0 | 44.3 | 74.0 | 44.3 |
| | (c-1) Epoxy resin EP-17 | 0.6 | 1.0 | 1.0 | 1.0 | 1.0 |
| | (d-1) Stabilizer AO-60 | 0.3 | 0.5 | 0.3 | 0.5 | 0.3 |
| | (d-2) Stabilizer AX-71 | | 0.2 | 0.2 | 0.2 | 0.2 |
| | (e-1) Mold releasing agent | 0.3 | 0.5 | 0.5 | 0.5 | 0.5 |
| | CNT/GF (mass ratio) | — | — | | — | |
| Evaluation | Maximum tensile strength | 142 | 141 | | 130 | |
| | Increase rate of maximum tensile strength | 106 | 109 | | 106 | |
| | Flexural strength | 216 | 205 | | 197 | |
| | Flexural modulus | 9860 | 10120 | | 9910 | |
| | Low warpage | B | A | | A | |
| | Absorbance at 76.5 GHz | 20.1 | 23.8 | | 28 | |
| | Reflectance at 76.5 GHz | 39.5 | 57.4 | | 54 | |
| | Transmittance at 76.5 GHz | 40.4 | 18.8 | | 18 | |
| | Frequency dependence of reflectance | 42.5 | 35.4 | | 44.4 | |
| | Rating of electro-magnetic wave absorptivity | C | C | | C | |
| | Overall rating of electromagnetic wave absorptivity and mechanical strength | 2 | 3 | | 3 | |

In Tables above, * represents the cases rewritten so as to adjust the total content of the resins to 100 parts by mass.

In Tables, CNT/GF represents mass proportion of the carbon nanotube and the glass fiber (carbon nanotube/glass fiber).

In Tables, the carbon nanotubes (b-1-1) to (b-1-3) are given not in terms of the amount of masterbatch, but in terms of the carbon nanotube per se. The same will apply to the masterbatch (b1-x1) and so forth.

As is clear from the results, the resin compositions of this invention were found to demonstrate high electromagnetic wave absorbance, low electromagnetic wave transmittance, and low reflectance, as well as small variation of reflectance depending on frequency of electromagnetic wave. The resin compositions of this invention were further found to excel in mechanical strength.

Example 2-1 to Example 2-6, Comparative Example 2-1 to Comparative Example 2-4-

<Production of Resin Composition (Pellet)>

From among the raw materials listed in Table 1 or 2 above, the individual components selected as summarized in Tables below were placed in a stainless steel tumbler, and mixed under stirring for one hour. The obtained mixture was fed into an intermeshed co-rotation twin screw extruder ("TEX-30α", from Japan Steel Works, Ltd., screw diameter=32 mm, L/D=42) through a main feeding port. The content was plasticized at a barrel preset temperature in the first kneading zone of 260° C. (exceptionally 280° C. for Comparative Examples 2-5, 2-6), the reinforcing material (glass fiber) whose proportion being given in Tables below was fed through a side feeder, the barrel temperature after addition of the glass fiber was set to 250° C. (exceptionally 280° C. for Comparative Examples 2-5, 2-6), the content was melt-kneaded at a discharge rate of 40 kg/h, and a screw speed of 200 rpm, and then extruded into strands through a four-hole nozzle (4 mm diameter round hole, 1.5 cm long). The extruded strands were introduced into a water bath for cooling, and then inserted into a pelletizer for cutting, to obtain a resin composition (pellet).

<Rating by UL94 Combustion Test>

The obtained pellet was dried at 120° C. for 5 hours, and then injection-molded into a 125 mm×13 mm×0.8 mm thick test specimen, with use of an injection molding machine ("J50", from Japan Steel Works, Ltd.), at a cylinder temperature of 260° C. (exceptionally 280° C. for Comparative Examples 2-5, 2-6), and a die temperature of 80° C.

With use of the obtained test specimen, dripping during combustion and combustion time were measured in compliance with UL94 combustion test, and rated.

<Tensile Property>

The obtained resin pellet was dried at 120° C. for 5 hours, and then injection-molded into an ISO multi-purpose test specimen (4 mm thick), with use of an injection molding machine ("J85AD", from Japan Steel Works, Ltd.), at a cylinder temperature of 250° C. (exceptionally 280° C. for Comparative Examples 2-5, 2-6), and a die temperature of 80° C.

With use of the thus molded multi-purpose ISO multi-purpose test specimen, maximum tensile strength (in MPa), tensile modulus (in MPa), and tensile strain (in %) were measured in compliance with ISO527-1 and ISO527-2.

<Flexural Properties>

Flexural properties were measured in the same way as described in Examples 1-1 to 1-8, and Comparative Examples 1-1 to 1-10.

<Notched Charpy Impact Strength>

The pellet obtained by the aforementioned method for production was dried at 120° C. for 5 hours, and then injection-molded in to an ISO tensile test specimen (4 mm thick), with use of an injection molding machine ("J85AD", from Japan Steel Works, Ltd.), at a cylinder temperature 250° C., and a die temperature of 80° C. Note, however, that a cylinder temperature of 280° C., and a die temperature of 80° C. were applied to Comparative Example 2-5 and Comparative Example 2-6.

The ISO multi-purpose test specimen was cut in a predetermined size in compliance with ISO179, and notched Charpy impact strength was measured, and denoted in $KJ/m^2$.

<Absorbance, Transmittance, and Reflectance>

The obtained pellet was injection-molded with use of an injection molding machine ("NEX80", from Nissei Plastic Industrial Co., Ltd.), at a cylinder preset temperature of 260° C. (exceptionally 280° C. for Comparative Examples 2-5, 2-6), and a die temperature 80° C., to obtain a 100 mm×100 mm×2 mm thick test specimen. With use of the obtained test specimen, the absorbance determined by Equation (A) above, the reflectance determined by Equation (B) above, and, the transmittance determined by Equation (C) above, all at 76.5 GHz frequency, were measured as described below.

A network analyzer "N5252A" from Keysight Technologies was used for the measurement.

For the measurement, the test specimen was placed while aligning the transverse direction of injection-molded article in parallel with the direction of electric field.

<Frequency Dependence of Reflectance>

The thus obtained test specimen was subjected to measurement of reflectance over the range from 70 to 80 GHZ frequency, and difference between the maximum reflectance and the minimum reflectance was calculated. The smaller the difference between the maximum reflectance and the minimum reflectance, the smaller the frequency dependence, meaning that the obtained resin composition is stable.

<Rating of Electromagnetic Wave Absorptivity>

The electromagnetic wave absorptivity was rated as A if all of absorbance, reflectance and transmittance were satisfied, rated as B if at least the absorbance satisfied the following items (excluding the case applicable to A), and rated as C, if applicable to neither A nor B.

Rating Criteria absorbance≥50.0% reflectance<30.0% transmittance<25.0%

<Surface Resistivity>

The thus obtained pellet was injection-molded with use of an injection molding machine ("NEX80", from Nissei Plastic Industrial Co., Ltd.), at a cylinder preset temperature of 260° C. (exceptionally 270° C. for Comparative Examples 2-5, 2-6), and a die temperature of 80° C., to obtain a 100 mm×100 mm×2 mm thick test specimen.

The obtained test specimen was subjected to measurement of surface resistivity (in Q), in compliance with IEC60093. For the measurement, "R8340 ultra high resistance meter" from ADVANTEST Corporation was used.

<Volume Resistivity>

The thus obtained pellet was injection-molded with use of an injection molding machine ("NEX80", from Nissei Plastic Industrial Co., Ltd.), at a cylinder preset temperature of 260° C. (exceptionally 270° C. for Comparative Examples 2-5, 2-6), and a die temperature of 80° C., to obtain a 100 mm×100 mm×2 mm thick test specimen.

The obtained test specimen was subjected to measurement of volume resistivity (in Q-cm), in compliance with IEC60093. For the measurement, "R8340 ultra high resistance meter" from ADVANTEST Corporation was used.

<Overall Rating of Flame Retardance and Electromagnetic Wave Absorbance>

Overall rating was made as below, on the basis of the results of the aforementioned combustion test and electromagnetic wave absorptivity.

The case rated V-0 was given a score of 3, rated V-1 given a score of 2, rated V-2 given a score of 1, and rated "incompatible" given a score of 0. On the other hand, The case rated A for the electromagnetic wave absorptivity was given a score of 2, rated B given a score of 1, and rated C given a score of 0. The total score of the combustion test and the rating of electromagnetic wave absorptivity was used for the overall rating on a scale of five.

<Chemical Resistance>

A jig capable of applying three-point flexural load illustrated in FIG. 1 was used in an environment at 23° C. The obtained ISO multi-purpose test specimen (4 mm thick) (indicated by reference sign 1 in FIG. 1) was attached to the lower center part of a test specimen fitting jig 2. The amount of strain was adjusted and fixed to 1%, by attaching an adjustment cylinder 3 for controlling the amount of stress to the test specimen fitting jig 2, and by fixing the cylinder with a thumbscrew 4. The distance between the adjustment cylinders 3 was set to 100 mm. A 10 mm×20 mm gauze, impregnated with regular unleaded gas, was placed at the center of the attached test specimen, and the appearance of the test specimen was visually observed 24 hours after, and judged according to the criteria below.

A: No crack.

B: Cracked or broken.

<Deflection Temperature Under Load>

The thus obtained ISO multi-purpose test specimen (4 mm thick) was subjected to measurement of deflection temperature under load (in ° C.) under a 1.80 MPa load, in compliance with ISO75-1 and 75-2.

For the measurement of deflection temperature under load, "AUTO HDT Tester 6A-2V" from Toyo Seiki Seisakusho, Ltd. was used.

TABLE 7

| | Item | Unit | Example 2-1 | Example 2-2 | Example 2-3 | Example 2-4 | Example 2-5 |
|---|---|---|---|---|---|---|---|
| Chemical composition | (a-1) PBT | parts by mass | 100 | 100 | 100 | 100 | 100 |
| | (b-1-1) Carbon nanotube | | 0.8 | 0.9 | 2.7 | 2.6 | 2.7 |
| | (f-1) Flame retardant auxiliary (antimony compound) | | 4.5 | 5.8 | 5.9 | 6.1 | 6.3 |
| | (g-1) Flame retardant auxiliary CXB2000H | | 11.2 | 15.7 | 16.0 | | |
| | (g-2) Flame retardant FR1025 | | | | | 11.5 | |
| | (g-3) Flame retardant FR-53 | | | | | | 13.9 |
| | (b-2) Reinforcing material (glass fiber) T-127 | | 51 | 54 | 55 | 53 | 54 |
| | (d-1) Stabilizer AO-60 | | 0.3 | 0.4 | 0.4 | 0.4 | 0.4 |
| | (e-1) Mold releasing agent 100P | | 0.3 | 0.4 | 0.4 | 0.4 | 0.4 |
| | (c-2) Epoxy resin jer1003 | | 1.7 | 1.8 | 1.8 | 1.8 | 1.8 |
| | CNT/Br | | 0.14 | 0.11 | 0.32 | 0.33 | 0.33 |
| Evaluation | Rating of UL94 combustion test (0.8 mm thick) | Rating | V-1 | V-0 | V-0 | V-0 | V-0 |
| | Dripping during combustion | — | No | No | No | No | No |
| | Combustion time | s | 67.0 | 5.0 | 31.0 | 15.0 | 18.0 |
| | Maximum tensile strength | MPa | 142 | 143 | 138 | 143 | 143 |
| | Tensile modulus | MPa | 10460 | 10710 | 10985 | 11230 | 11230 |
| | Tensile strain | % | 2.3 | 2.2 | 2.1 | 2.2 | 2.2 |
| | Flexural strength | MPa | 218 | 216 | 212 | 213 | 221 |
| | Flexural modulus | MPa | 10140 | 10480 | 11100 | 10570 | 11020 |
| | Notched Charpy impact strength | $kJ/m^2$ | 7.9 | 7.9 | 6.9 | 8.1 | 7.2 |
| | Absorbance at 76.5 GHz | % | 57.8 | 58.9 | 74.2 | 73.4 | 74.1 |
| | Reflectance at 76.6 GHz | % | 22.2 | 24.0 | 24.5 | 20.0 | 22.5 |
| | Transmittance at 76.7 GHz | % | 20.0 | 17.1 | 1.3 | 6.6 | 3.4 |
| | Frequency dependence of reflectance | | 12.6 | 10.2 | 0.9 | 8.0 | 2.3 |
| | Rating of electromagnetic wave absorptivity | Rating | A | A | A | A | A |
| | Surface resistivity | Ω | $2.3 \times 10^{14}$ | $6.8 \times 10^{14}$ | $1.2 \times 10^{11}$ | $9.9 \times 10^{13}$ | $2.7 \times 10^{14}$ |
| | Volume resistivity | Ω · cm | $1.2 \times 10^{16}$ | $9.4 \times 10^{15}$ | $7.7 \times 10^{10}$ | $4.24 \times 10^{13}$ | $1.7 \times 10^{12}$ |
| | Overall rating of flame retardance and electromagnetic wave absorptivity | | 4 | 5 | 5 | 5 | 5 |
| | Chemical resistance | | A | A | A | A | A |
| | Deflection temperature under load | ° C. | 210 | 210 | 210 | 206 | 208 |

TABLE 8

| | Item | Unit | Example 2-6 | Comparative Example 2-1 | Comparative Example 2-2 | Comparative Example 2-3 | Comparative Example 2-4 |
|---|---|---|---|---|---|---|---|
| Chemical composition | (a-1) PBT | parts by mass | 100 | 100 | 100 | 100 | 100 |
| | (b-1-1) Carbon nanotube | | 2.6 | | | | |
| | (f-1) Flame retardant auxiliary (antimony compound) | | 4.5 | 4.4 | 6.2 | 6.0 | 6.1 |
| | (g-1) Flame retardant auxiliary CXB2000H | | 11.4 | 11.1 | 15.6 | | |
| | (g-2) Flame retardant FR1025 | | | | | 11.2 | |
| | (g-3) Flame retardant FR-53 | | | | | | 13.5 |
| | (b-2) Reinforcing material (glass fiber) T-127 | | 52 | 51 | 53 | 51 | 52 |
| | (d-1) Stabilizer AO-60 | | 0.4 | 0.3 | 0.4 | 0.3 | 0.3 |
| | (e-1) Mold releasing agent 100P | | 0.4 | 0.3 | 0.4 | 0.3 | 0.3 |
| | (c-2) Epoxy resin jer1003 | | 1.7 | 1.7 | 1.8 | 1.7 | 1.7 |
| | CNT/Br | | 0.44 | 0.00 | 0.00 | 0.00 | 0.00 |
| Evaluation | Rating of UL94 combustion test (0.8 mm thick) | Rating | Not applicable | V-2 | V-2 | V-2 | V-2 |
| | Dripping during combustion | — | No | Yes | Yes | Yes | Yes |
| | Combustion time | s | 271.0 | 44.0 | 38.0 | 40.0 | 15.0 |
| | Maximum tensile strength | MPa | 138 | 146 | 145 | 142 | 146 |
| | Tensile modulus | MPa | 10720 | 10080 | 10060 | 10370 | 10260 |
| | Tensile strain | % | 1.9 | 2.5 | 2.6 | 2.5 | 2.4 |
| | Flexural strength | MPa | 214 | 218 | 217 | 214 | 212 |
| | Flexural modulus | MPa | 10850 | 9950 | 9950 | 9780 | 9490 |

TABLE 8-continued

| Item | Unit | Example 2-6 | Comparative Example 2-1 | Comparative Example 2-2 | Comparative Example 2-3 | Comparative Example 2-4 |
|---|---|---|---|---|---|---|
| Notched Charpy impact strength | $kJ/m^2$ | 7.1 | 9.0 | 8.9 | 9.8 | 9.4 |
| Absorbance at 76.5 GHz | % | 74.6 | 5.8 | 6.0 | 5.5 | 5.5 |
| Reflectance at 76.6 GHz | % | 23.9 | 8.0 | 7.8 | 8.6 | 8.3 |
| Transmittance at 76.7 GHz | % | 1.4 | 86.2 | 86.2 | 85.8 | 86.2 |
| Frequency dependence of reflectance | | | | | | |
| Rating of electromagnetic wave absorptivity | Rating | A | C | C | C | C |
| Surface resistivity | Ω | $1.2 \times 10^{11}$ | $4.9 \times 10^{15}$ | $1.9 \times 10^{15}$ | $1.3 \times 10^{15}$ | $2.0 \times 10^{15}$ |
| Volume resistivity | Ω · cm | $4.7 \times 10^{10}$ | $3.0 \times 10^{17}$ | $1.8 \times 10^{16}$ | $6.6 \times 10^{16}$ | $2.1 \times 10^{17}$ |
| Overall rating of flame retardance and electromagnetic wave absorptivity | | 2 | 1 | 1 | 1 | 1 |
| Chemical resistance | | — | A | A | A | A |
| Deflection temperature under load | ° C. | — | — | — | — | — |

In Tables, the carbon nanotubes (b-1-1) to (b-1-3) are given not in terms of the amount of masterbatch, but in terms of the carbon nanotube per se.

The formed articles formed of the resin compositions in Examples 2-1 to 2-5 were found to demonstrate high absorbance, to excel in the flame retardance and heat resistance, as well as to demonstrate high mechanical strength. Moreover, the formed articles formed of the resin compositions in Example 2-1 to 2-5 were found to demonstrate small transmittance and reflectance.

INDUSTRIAL APPLICABILITY

Millimeter-wave radar has been suffered from malfunction due to noise ascribed not only to transmissive electromagnetic wave, but also to reflective electromagnetic wave. Hence a material having high electromagnetic wave absorbance, small transmittance, and small reflectance has been increasingly demanded. The resin composition of this invention can meet the demands, and can also meet the demands for higher levels of flame retardance and chemical resistance.

The resin composition of this invention are therefore widely expectable for applications where flame retardance, chemical resistance, and electromagnetic wave absorptivity are required.

REFERENCE SIGNS LIST

1 ISO multi-purpose test specimen
2 Test specimen fitting jig
3 Adjustment cylinder for controlling amount of stress
4 Thumbscrew

The invention claimed is:

1. A resin composition, comprising:

a thermoplastic resin comprising (i) a polybutylene terephthalate resin and (ii) a polycarbonate resin in a range of from 1.0 to 75 parts by mass, per 100 parts by mass of the polybutylene terephthalate resin; and an electromagnetic wave absorbing material, wherein the resin composition, when formed to a size of 150 mm×150 mm×2 mm thick, has (A) an absorbance at 76.5 GHz frequency in a range of from 40.0 to 100%, by Equation (A)

$$\text{Absorbance (\%)} = 100 - \left(\frac{1}{10^{-R/10}} \times 100 + \frac{1}{10^{-T/10}} \times 100\right), \quad \text{(A)}$$

R being return loss and T being transmission attenuation, each measured by free space method; and (B) a difference between a maximum value and a minimum value of reflectance in a range of from 70 GHz to 80 GHz frequency of 20.0% or smaller, by Equation (B)

$$\text{Reflectance (\%)} = \frac{1}{10^{-R/10}} \times 100, \quad \text{(B)}$$

R being return loss measured by the free space method.

2. The resin composition of claim 1, wherein the electromagnetic wave absorbing material is a carbon-comprising electromagnetic wave absorbing material.

3. The resin composition of claim 1, further comprising: a carbon nanotube in a range of from 0.1 to 10.0 parts by mass, per 100 parts by mass of the thermoplastic resin, wherein the resin composition, when formed to the size of 150 mm×150 mm×2 mm thick, has an absorbance at 76.5 GHz frequency in a range of from of 40.0 to 100%, by the Equation (A); and a difference between the maximum value and minimum value of the reflectance in the range of from 70 GHz to 80 GHz frequency of 20.0% or smaller, by the Equation (B).

4. The resin composition of claim 1, further comprising:

a glass fiber in a range of from 10 to 100 parts by mass, per 100 parts by mass of the thermoplastic resin.

5. The resin composition of claim 4, wherein the electromagnetic wave absorbing material and the glass fiber have an electromagnetic wave absorbing material/glass fiber mass proportion in a range of from 0.01 to 0.30.

6. The resin composition of claim 1, further comprising:

a reactive compound in a range of from 0.01 to 5.0 parts by mass, per 100 parts by mass of the thermoplastic resin.

7. The resin composition of claim 1, further comprising, per 100 parts by mass of the polybutylene terephthalate resin:

a polystyrene-based resin in a range of from 1.0 to 60 parts by mass.

8. The resin composition of claim 1, wherein the thermoplastic resin further comprises a polypropylene resin.

9. The resin composition of claim 1, wherein the thermoplastic resin further comprises a polyamide resin.

10. The resin composition of claim 1, wherein the electromagnetic wave absorbing material comprises a multilayered carbon nanotube.

11. The resin composition of claim 1, having a content of carbon fiber of less than 3% by mass.

12. The resin composition of claim 1, when formed to a size of 150 mm×150 mm×2 mm thick, having a reflectance at 76.5 GHz frequency of 40.0% or smaller, by the Equation (B).

13. The resin composition of claim 1, when formed to a size of 150 mm×150 mm×2 mm thick, having a transmittance at 76.5 GHz frequency of 15.0% or smaller, by Equation (C):

$$\text{Transmittance (\%)} = \frac{1}{10^{-T/10}} \times 100, \qquad \text{(C)}$$

wherein T is transmission attenuation measured by the free space method.

14. The resin composition of claim 1, further comprising: a flame retardant.

15. The resin composition of claim 14, wherein the flame retardant is a bromine-comprising flame retardant.

16. An electromagnetic wave absorber formed of a resin composition of claim 1.

17. A resin composition, comprising:

a thermoplastic resin comprising (i) a polybutylene terephthalate resin and, per 100 parts by mass of the polybutylene terephthalate resin, (ii-a) a polycarbonate resin in a range of from 1.0 to 75 parts by mass and/or (ii-b) a polystyrene-based resin in a range of from 1.0 to 60 parts by mass, wherein the resin composition, when formed to a size of 150 mm×150 mm×2 mm thick, has (A) an absorbance at 76.5 GHz frequency of 60.0% or larger and determined by Equation (A)

$$\text{Absorbance (\%)} = 100 - \left(\frac{1}{10^{-R/10}} \times 100 + \frac{1}{10^{-T/10}} \times 100\right), \qquad \text{(A)}$$

R being return loss and T being transmission attenuation, each measured by free space method; and a reflectance at 76.5 GHz frequency of 30.0% or smaller, by Equation (B)

$$\text{Reflectance (\%)} = \frac{1}{10^{-R/10}} \times 100, \qquad \text{(B)}$$

R being return loss measured by the free space method;

a transmittance of 10.0% or smaller at 76.5 GHz frequency, by Equation (C)

$$\text{Transmittance (\%)} = \frac{1}{10^{-T/10}} \times 100, \qquad \text{(C)}$$

T being transmission attenuation measured by the free space method.

18. The resin composition of claim 17, comprising the polycarbonate resin.

19. The resin composition of claim 17, comprising the polystyrene-based resin.

20. A resin composition, comprising:

a thermoplastic resin comprising (i) a polybutylene terephthalate resin and (ii) a polystyrene-based resin in a range of from 1.0 to 60 parts by mass, per 100 parts by mass of the polybutylene terephthalate resin; and an electromagnetic wave absorbing material, wherein the resin composition, when formed to a size of 150 mm×150 mm×2 mm thick, has (A) an absorbance at 76.5 GHz frequency in a range of from 40.0 to 100%, by Equation (A)

$$\text{Absorbance (\%)} = 100 - \left(\frac{1}{10^{-R/10}} \times 100 + \frac{1}{10^{-T/10}} \times 100\right), \qquad \text{(A)}$$

R being return loss and T being transmission attenuation, each measured by free space method; and (B) a difference between a maximum value and a minimum value of reflectance in a range of from 70 GHz to 80 GHz frequency of 20.0% or smaller, by Equation (B)

$$\text{Reflectance (\%)} = \frac{1}{10^{-R/10}} \times 100, \qquad \text{(B)}$$

R being return loss measured by the free space method.

21. A resin composition, comprising:

a thermoplastic resin;

a glass fiber in a range of from 10 to 100 parts by mass, per 100 parts by mass of the thermoplastic resin; and an electromagnetic wave absorbing material, wherein the electromagnetic wave absorbing material and the glass fiber have an electromagnetic wave absorbing material/glass fiber mass proportion in a range of from 0.01 to 0.30, and wherein the resin composition, when formed to a size of 150 mm×150 mm×2 mm thick, has (A) an absorbance at 76.5 GHz frequency in a range of from 40.0 to 100%, by Equation (A)

Absorbance $$\text{Absorbance (\%)} = 100 - \left(\frac{1}{10^{-R/10}} \times 100 + \frac{1}{10^{-R/10}} \times 100\right), \qquad \text{(A)}$$

(A),

R being return loss and T being transmission attenuation, each measured by free space method;

(B) a difference between a maximum value and a minimum value of reflectance in a range of from 70 GHz to 80 GHz frequency of 20.0% or smaller, by Equation (B)

Reflectance $$\text{Reflectance (\%)} = \frac{1}{10^{-R/10}} \times 100, \qquad \text{(B)}$$

R being return loss measured by the free space method.

* * * * *